(12) United States Patent
Rieger

(10) Patent No.: US 9,773,706 B2
(45) Date of Patent: Sep. 26, 2017

(54) SEMICONDUCTOR DEVICE HAVING FIELD-EFFECT STRUCTURES WITH DIFFERENT GATE MATERIALS, AND METHOD FOR MANUFACTURING THEREOF

(71) Applicant: Infineon Technologies Austria AG, Villach (AT)

(72) Inventor: Walter Rieger, Arnoldstein (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 14/817,733

(22) Filed: Aug. 4, 2015

(65) Prior Publication Data

US 2016/0043000 A1    Feb. 11, 2016

(30) Foreign Application Priority Data

Aug. 5, 2014 (DE) .................. 10 2014 111 140

(51) Int. Cl.
| | |
|---|---|
| *H01L 21/8234* | (2006.01) |
| *H01L 27/088* | (2006.01) |
| *H01L 29/423* | (2006.01) |
| *H01L 29/66* | (2006.01) |
| *H01L 29/78* | (2006.01) |

(52) U.S. Cl.
CPC ............. *H01L 21/82345* (2013.01); *H01L 21/823462* (2013.01); *H01L 21/823487* (2013.01); *H01L 27/088* (2013.01); *H01L 29/4236* (2013.01); *H01L 29/4238* (2013.01); *H01L 29/42364* (2013.01); *H01L 29/66545* (2013.01); *H01L 29/7827* (2013.01)

(58) Field of Classification Search
CPC ............. H01L 29/517; H01L 29/66545; H01L 21/268; H01L 21/28176; H01L 21/324; H01L 21/823857; H01L 29/49; H01L 29/513
USPC .... 257/E21.433, E21.53, E21.616, E27.062, 257/E29.255, 368, 410; 438/14, 199, 305
See application file for complete search history.

(56) References Cited

U.S. PATENT DOCUMENTS

| | | | |
|---|---|---|---|
| 7,754,593 B2 * | 7/2010 | Saito | ............... H01L 21/823443 257/E21.203 |
| 9,035,398 B2 * | 5/2015 | Won | ............... H01L 21/823842 257/288 |
| 9,343,372 B1 * | 5/2016 | Bao | ............... H01L 29/401 |
| 2006/0278934 A1 * | 12/2006 | Nagahama | ...... H01L 21/823842 257/369 |

(Continued)

FOREIGN PATENT DOCUMENTS

JP    04162771 A    6/1992

*Primary Examiner* — Edward Chin
(74) *Attorney, Agent, or Firm* — Murphy, Bilak & Homiller, PLLC

(57) ABSTRACT

A semiconductor device includes a semiconductor substrate, at least a first field-effect structure integrated in the semiconductor substrate and at least a second field-effect structure integrated in the semiconductor substrate. The first field-effect structure includes a first gate electrode comprised of a polycrystalline semiconductor material. The second field-effect structure includes a second gate electrode comprised of one of a metal, a metal alloy, a metal layer stack, a metal alloy layer stack and any combination thereof.

12 Claims, 21 Drawing Sheets

(56) References Cited

U.S. PATENT DOCUMENTS

2009/0283835 A1* 11/2009 Yu ..................... H01L 21/268
257/368
2012/0146159 A1* 6/2012 Wang ................. G03F 7/70633
257/410

* cited by examiner

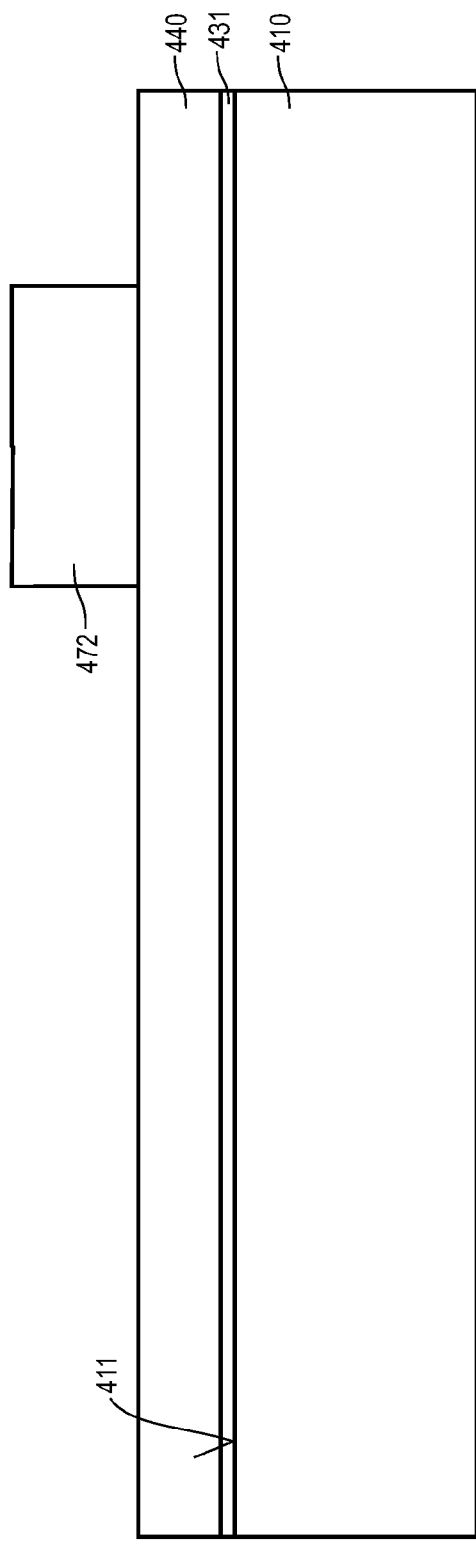
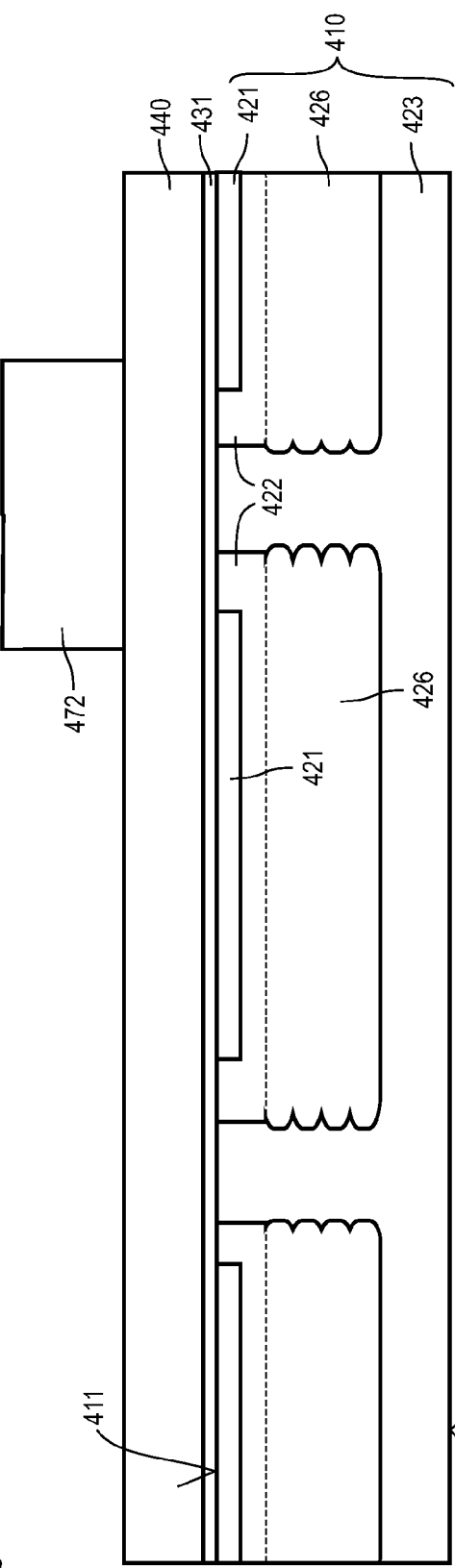
Fig. 4A
Fig. 4B

SEMICONDUCTOR DEVICE HAVING FIELD-EFFECT STRUCTURES WITH DIFFERENT GATE MATERIALS, AND METHOD FOR MANUFACTURING THEREOF

PRIORITY CLAIM

This application claims priority to German Patent Application No. 10 2014 111 140.0, filed on 5 Aug. 2014, the content of said German application incorporated herein by reference in its entirety.

TECHNICAL FIELD

Embodiments described herein relate to semiconductor devices having field-effect structures with different gate materials, and particularly to semiconductor devices having a field-effect transistor with a metal gate and a MOS-gated diode having a polycrystalline semiconductor gate. Further embodiments pertain to methods for manufacturing such semiconductor devices.

BACKGROUND

To reduce switching losses in power semiconductor devices, it is desired to reduce the distance between transistor cells of the power semiconductor device. One attempt to allow shrinkage of the transistor cells is to keep the size of the channel-forming region between adjacent trenches of the power semiconductor device small. As the size reduction, or pitch shrink, requires higher adjustment of the individual structures to be formed, self-adjusting processes are increasingly employed.

On consequence of the pitch-shrink of the transistor cells is the increase of the resistance of gate conductors or other conductive features. Typically, highly-doped polysilicon is used as conductive material for the gate conductors or other conductive features as polysilicon can be easy deposited and processed. However, the specific resistance of polysilicon increases disproportional with reducing cross-sectional area of the conductive structures made of polysilicon, because the influence of the polycrystalline structure of the polysilicon becomes more pronounced. Employment of metal as conductive material reduces the resistance but also brings about additional process problems.

In view of the above, there is a need for improvement.

SUMMARY

According to an embodiment, a semiconductor device includes a semiconductor substrate, at least a first field-effect structure integrated in the semiconductor substrate and at least a second field-effect structure integrated in the semiconductor substrate. The first field-effect structure includes a first gate electrode on and in contact with a first gate dielectric which is arranged between the first gate electrode and the semiconductor substrate, wherein the first gate electrode is comprised of a polycrystalline semiconductor material. The second field-effect structure includes a second gate electrode on and in contact with a second gate dielectric which is arranged between the second gate electrode and the semiconductor substrate, wherein the second gate electrode is comprised of one of a metal, a metal alloy, a metal layer stack, a metal alloy layer stack and any combination thereof, and is electrically insulated from the semiconductor substrate.

According to an embodiment, a method for manufacturing a semiconductor device includes: providing a semiconductor substrate having a first side; forming a first gate electrode on and in contact with a first gate dielectric of a first field-effect structure, wherein the first gate dielectric is arranged between the first gate electrode and the semiconductor substrate, and wherein the first gate electrode is comprised of a polycrystalline semiconductor material; and forming a second gate electrode on and in contact with a second gate dielectric of a second field-effect structure, wherein the second gate dielectric is arranged between the second gate electrode and the semiconductor substrate, wherein the second gate electrode is comprised of one of a metal, a metal alloy, a metal layer stack, a metal alloy layer stack and any combination thereof, and wherein the second gate electrode is electrically insulated from the semiconductor substrate.

Those skilled in the art will recognise additional features and advantages upon reading the following detailed description, and upon viewing the accompanying drawings.

BRIEF DESCRIPTION OF THE DRAWINGS

The components in the figures are not necessarily to scale, instead emphasis being placed upon illustrating the principles of the invention. Moreover, in the figures, like reference signs designate corresponding parts. In the drawings:

FIGS. 4A to 4G illustrate processes of a method for manufacturing a semiconductor device according to another embodiment.

DETAILED DESCRIPTION

Figure 1A:
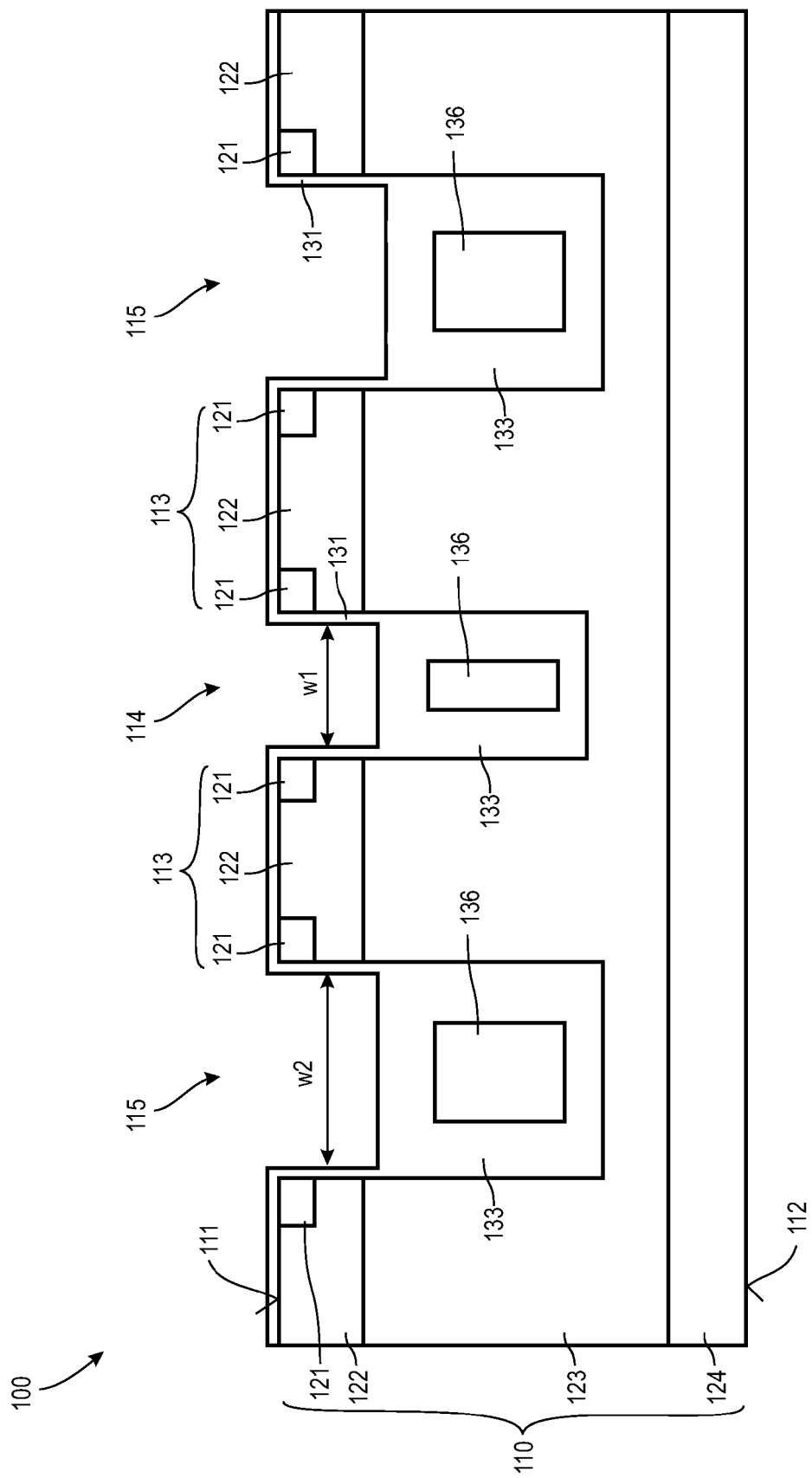
FIGS. 1A to 1F illustrate processes of a method for manufacturing a semiconductor device according to an embodiment.

In the following Detailed Description, reference is made to the accompanying drawings, which form a part hereof, and in which are shown by way of illustration specific embodiments in which the invention may be practiced. In this regard, directional terminology, such as "top", "bottom", "front", "back", "leading", "trailing", "lateral", "vertical" etc., is used with reference to the orientation of the Figure(s) being described. Because components of embodiments can be positioned in a number of different orientations, the directional terminology is used for purpose of illustration and is in no way limiting. It is to be understood that other embodiments may be utilised and structural or logical changes may be made without departing from the scope of the present invention. The following detailed description, therefore, is not to be taken in a limiting sense, and the scope of the present invention is defined by the appended claims. The embodiments being described use specific language, which should not be construed as limiting the scope of the appended claims.

In this specification, a second side or surface of a semiconductor substrate is considered to be formed by the lower or back-side side or surface while a first side or surface is considered to be formed by the upper, front or main side or surface of the semiconductor substrate. The terms "above" and "below" as used in this specification therefore describe a relative location of a structural feature to another structural feature with consideration of this orientation.

The terms "electrical connection" and "electrically connected" describes an ohmic connection between two elements.

An embodiment is described next with reference to FIGS. 1A to 1F. This embodiment includes formation of a semiconductor device 100 having a first field-effect structure 151 with a polysilicon gate 141 and a second field-effect structure 152 with a metal gate 142. This embodiment is a mask-less process with respect to the selective formation of the polysilicon gate 141 and the metal gate 142.

As illustrated in FIG. 1A, a semiconductor substrate 110 having a first side 111 and a second side 112 opposite the first side 111 is provided. The semiconductor substrate 110 can be a monolithic semiconductor substrate which is typically n-doped. Alternatively, the semiconductor substrate 110 can include a monolithic semiconductor body 124 and an epitaxial layer 123 formed on the semiconductor body 124. The semiconductor body 124 can be highly n-doped and later forms an n-doped drain region 124 of the semiconductor device. The epitaxial layer 123 is typically a weakly n-doped layer which later forms the drift region of the semiconductor device. A semiconductor device formed with n-doped semiconductor substrate 110 is a so-called n-channel device.

As a further alternative, the semiconductor substrate 110, the monolithic semiconductor body 124 and the epitaxial layer 123 can also be of p-type. In this case, the semiconductor device to be formed is a so-called p-channel device.

The semiconductor substrate 110 can be made of any semiconductor material suitable for manufacturing semiconductor components. Examples of such materials include, without being limited thereto, elementary semiconductor materials such as silicon (Si), group IV compound semiconductor materials such as silicon carbide (SiC) or silicon germanium (SiGe), binary, ternary or quaternary III-V semiconductor materials such as gallium arsenide (GaAs), gallium phosphide (GaP), indium phosphide (InP), gallium nitride (GaN), aluminium gallium nitride (AlGaN), indium gallium phosphide (InGaPa) or indium gallium arsenide phosphide (InGaAsP), and binary or ternary II-VI semiconductor materials such as cadmium telluride (CdTe) and mercury cadmium telluride (HgCdTe) to name few. The above mentioned semiconductor materials are also referred to as homojunction semiconductor materials. When combining two different semiconductor materials a heterojunction semiconductor material is formed. Examples of heterojunction semiconductor materials include, without being limited thereto, silicon ($Si_xC_{1-x}$) and SiGe heterojunction semiconductor material. For power semiconductor applications currently mainly Si, SiC and GaN materials are used.

In a further process, at least a first trench 114 and a second trench 115 are formed in the semiconductor substrate 110 at the first side 111 of the semiconductor substrate 110. The first field-effect structure 151 is later formed in the first trench 114, and the second field-effect structure 152 is later formed in the second trench 115. The first and second trenches 114, 115 can be formed, for example, by anisotropic etching using an etching mask (not shown). Mesa regions 113 remain between adjacent first and second trenches 114, 115. Typically, both the first and second trenches 114, 115 are formed in a common etching process using a common etching mask.

The number of the first and second trenches 114, 115 can be selected according to specific needs. For example, the number of the first and second trenches 114, 115 can be the same. Alternatively, the number of the second trenches 115, used for forming respective second field-effect structures 152 such as field-effect transistors, can be larger than the number of the first trenches 114 used to form respective first field-effect structures such as a MOS-gated diode, for example.

Furthermore, as power semiconductor devices include a plurality of cells each forming a respective field-effect structure, the local density of the first and second trenches 114, 115, i.e. the number of the trenches in a given area, can vary depending on the desired overall property of the semiconductor device 100.

The first trench 114 is formed to have a first width w1 in a lateral direction. The second trench 115 is formed to have a second width w2 in the lateral direction. The second width w2 is larger than the first width w1. For example, the width w2 can be in a range from about 100 nm to about 1000 nm or even larger, for example up to about 2500 nm for high voltage devices. The first width w1 can be in a range from about 50 nm to about 200 nm.

In a further process, a field oxide 133 and a field electrode 136 are formed in a lower portion of each of the first and the second trenches 114, 115. The field oxide 133 is formed by thermal oxidation of the exposed portions of the first and second trenches 114, 115. The field oxide 133 is comparably thick to withstand the high voltage which occurs during operation of the semiconductor device. The thickness of the field oxide 133 can be in a range from about 50 nm to about 2000 nm. The field oxide 133 is typically thicker than the later formed first and second gate dielectrics 131, 132.

The field electrode 136 is formed by deposition of doped polysilicon followed by an anisotropic etching to remove the polysilicon from regions outside the first and the second trenches 114, 115. The polysilicon is then etched back so that the upper surface of the polysilicon is recessed relative to the upper surface of the semiconductor substrate 110.

In a further process, the upper portion of the polysilicon is thermally oxidized to form an insulating cover on the field electrode 136 as illustrated in FIG. 1A. The insulating cover can also be formed by depositing an oxide layer, for example by High-density Pressure Deposition (HDP), followed by an etching back step.

In further processes, respective p-doped body regions 122 and n-doped source regions 121 are formed in the semiconductor substrate 110 for each of the first and second field-effect structures 151, 152. The body regions 122 are typically formed by a mask-less implantation while the source regions 121 are formed by an implantation process using a mask.

The body regions 122 and the source region 121 are formed particularly in the mesa regions 113 between the first and second trenches 114, 115. Typically, the body regions 122 laterally extend up to the sidewalls of the respective trenches 114, 115 to form channel regions along the sidewalls of the trenches 114, 115. A respective single channel region runs from the respective source region 121 to the drift region 123.

According to an embodiment, the field electrodes 136 are electrically connected with the source regions 121 so that the electrical potential applied to the source regions 121 is also applied to the field electrodes 136 during operation of the semiconductor device 100. Alternatively, the field electrodes 136, or some of the field electrodes 136, can be electrically insulated from the source regions 121, and can be in electrical contact with a separate contact pad at the first side of the semiconductor device to allow applying an electrical potential to the field electrodes which is different from the source potential.

According to an embodiment, a first gate dielectric 131 is formed at least in the first trench 114. Typically, the first gate dielectric 131 is formed by thermal oxidation of the semiconductor material on all exposed surfaces of the semiconductor substrate 110 including portions of the second trench 115. The first gate dielectric 131 has a first thickness which can be between 3 nm and 15 nm, and particularly between 4 nm and 7 nm. The first thickness is comparably thin and defines, together with the doping concentration of the body region 122, the threshold of the first field-effect structure 151.

FIG. 1A thus illustrates a process of providing a semiconductor substrate 110 having a first side 111, and of forming a first gate dielectric 131 of a first field-effect structure 151 in a first trench 114. More specifically, FIG. 1A illustrates forming, at the first side 111 of the semiconductor substrate 110, a first trench 114 in the semiconductor substrate 110 for the first field-effect structure 151 and a second trench 115 in the semiconductor substrate 110 for the second field-effect structure 152, wherein the first trench 114 has a first width w1 in the lateral direction and the second trench 115 has a second width w2 in the lateral direction, which is larger than the first width w1, and forming the first gate dielectric 131 at least in the first trench 114.

The first and second trenches 114, 115 have a remaining depth from the upper surface of the semiconductor substrate 110 to the upper surface of the polysilicon cover above the field electrodes 136. The remaining depth is typically at least equal to or larger than the first width w1.

Figure 1B:
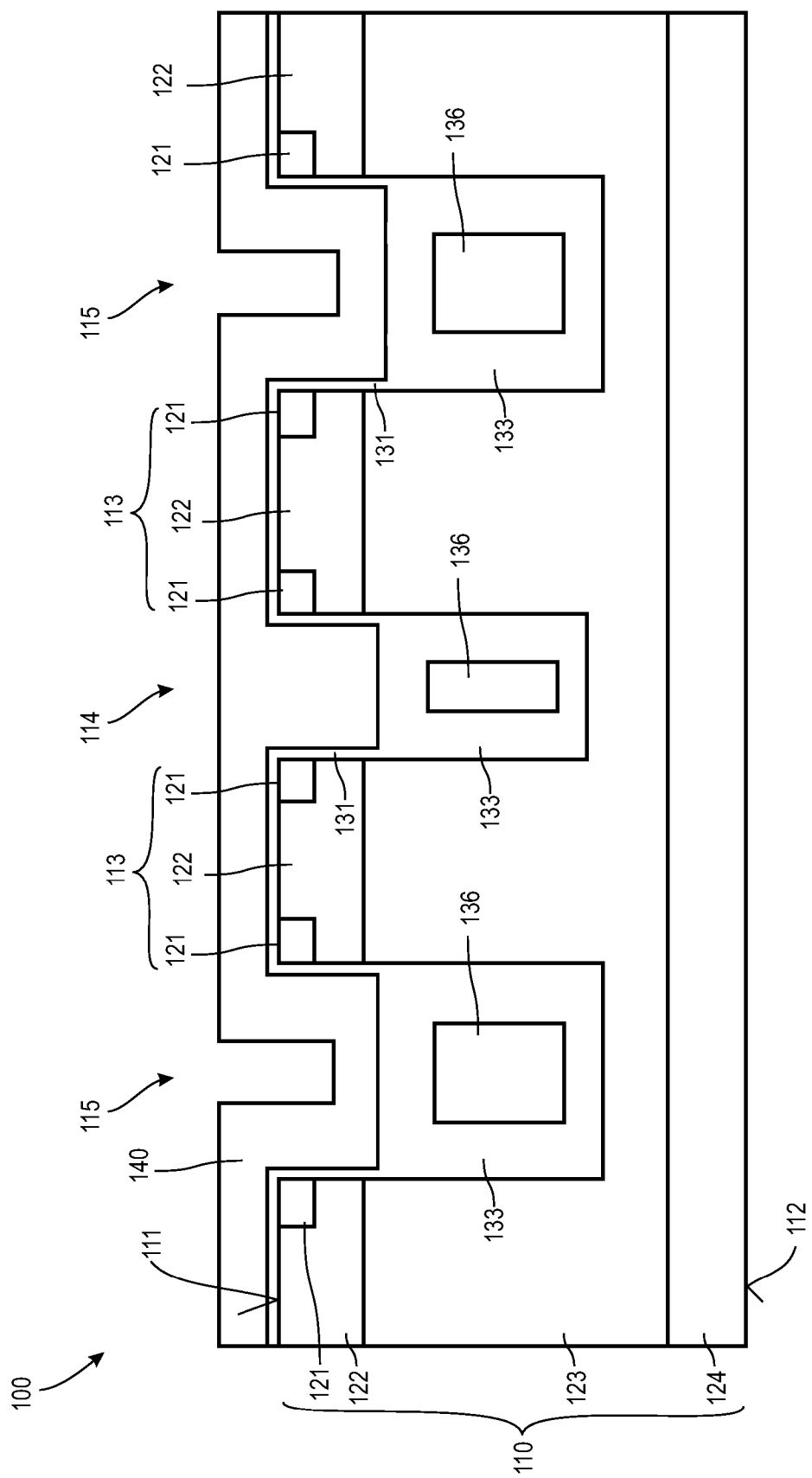

In a further process, as illustrated in FIG. 1B, a polycrystalline layer 140 is deposited. The polycrystalline layer 140 can be, for example, a polycrystalline semiconductor layer made of, for example, doped or undoped polysilicon. The polycrystalline layer 140 can be subsequently doped, or can be in-situ doped during deposition.

The polycrystalline layer 140, which is referred hereinafter as polysilicon layer 140, has a thickness which is larger than 0.5*w1 and less than 0.5*w2, typically less than 0.4*w2 and more typically less than 0.3*w2. When, for example, conformally deposited, the polysilicon layer 140 fills the trenches 114, 115 and lines the sidewalls of the first and second trenches 114, 115. As the first trench 114 is smaller than the second trench 115, the first trench 114 is completely filled by the layer 140 while the second trench 115 is only partially filled by the polysilicon layer 140, as the polysilicon layer 140 deposited on opposite sidewalls of the second trench 115 does not merge unlike in the first trench 114. The remaining gap, as shown in FIG. 1B, can have a lateral width of at least 50 nm to 100 nm depending on the width w2 and the final thickness of the polysilicon layer 140.

A suitable deposition process can be employed for depositing the polysilicon layer 140.

FIG. 1B thus illustrates a process of depositing a polycrystalline layer 140 of a polycrystalline semiconductor material in the first and second trench 114, 115, wherein the polycrystalline layer 140 has a thickness which is larger than half of the first width w1 of the first trench 114 and which is less than half of the second width w2 of the second trench 115.

Figure 1C:
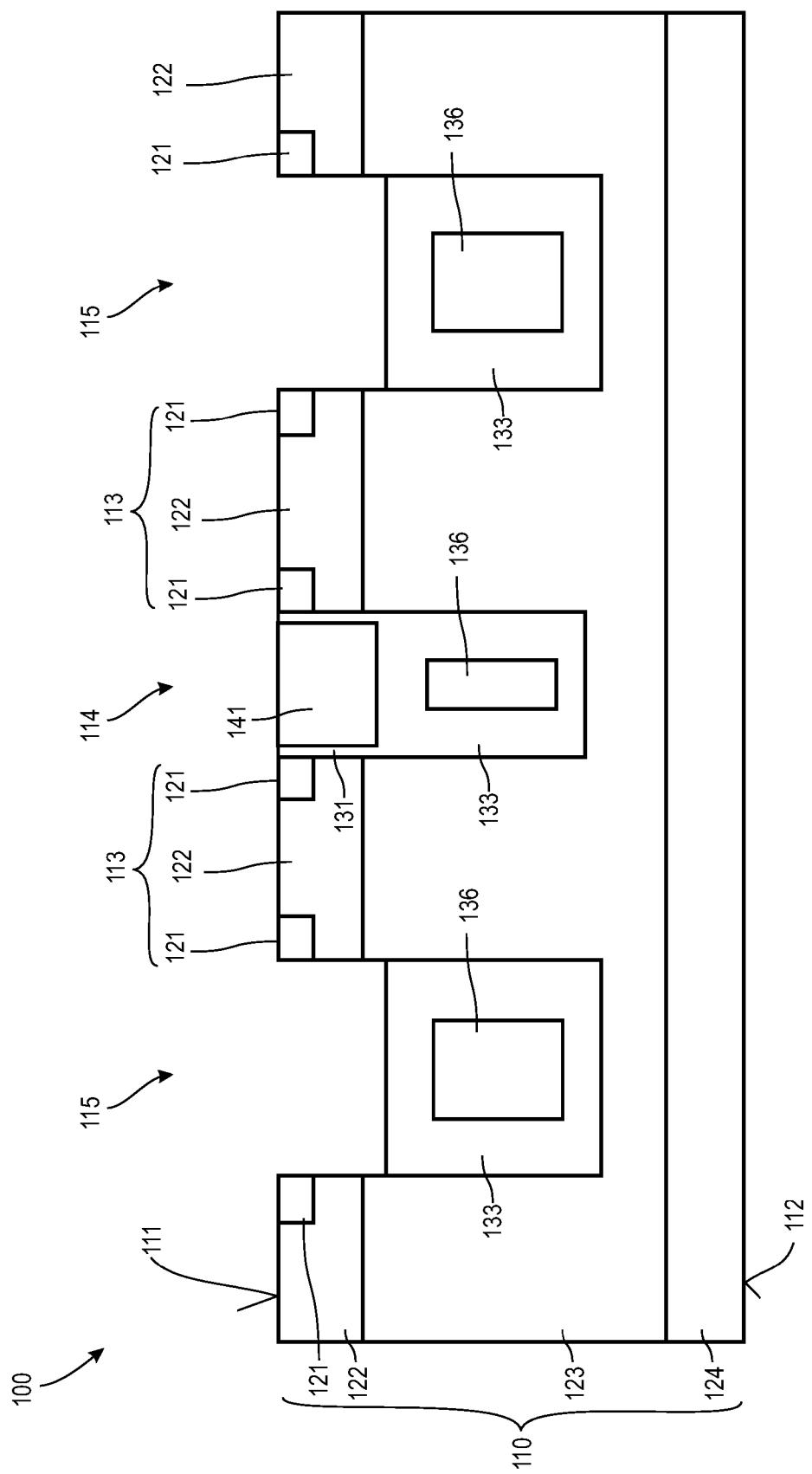

In a further process, as illustrated in FIG. 1C, the polysilicon layer 140 is isotropically etched, for example using a plasma etching process. Since the polysilicon layer 140 completely fills the first trench 114, the thickness, in vertical direction, of the deposited polysilicon material of the polysilicon layer 140 is larger in the first trench 114 in comparison to the second trench 115 so that the removal of the polysilicon layer 140 from the first trench 114 would need more time than the removal from the second trench 115. By adjusting the etching time, the polysilicon layer 140 can thus be completely removed from the second trench 115 without removing the polysilicon layer 140 from the first trench 114. Alternatively, the etching time can be controlled by monitoring the etching to detect, when the first gate dielectric 131 becomes exposed. The first gate dielectric 131 thus also functions as optical etch stop.

Alternatively, the polysilicon layer 140 can be removed by chemical-mechanical polishing processes which stops at the first gate dielectric 131.

After removal of the polysilicon layer 140 from the second trench 115 and the upper side 111 of the semiconductor substrate 110, the exposed portion of the first gate dielectric 131 is removed, for example using HF. This results in exposing the semiconductor substrate 110 outside of the first trench 114, particularly in the second trench 115. The remaining portions of the polysilicon layer 140 which cover the first gate dielectric 131 functions as mask during this removal. The portions of the first gate dielectric 131 which are not covered by the remaining portions of the polysilicon layer 140 are thus removed.

The polysilicon material left in the first trench 114 forms the gate electrode 141 of the first field-effect structure 151.

Thus, FIG. 1C illustrates processes of forming a first gate electrode 141 on and in contact with the first gate dielectric 131 of a first field-effect structure 151, wherein the first gate dielectric 131 is arranged between the first gate electrode 141 and the semiconductor substrate 110, and wherein the first gate electrode 141 is comprised of a polycrystalline semiconductor material. More specifically, FIG. 1C illustrates processes of isotropic etching the polycrystalline layer 140 to remove the polycrystalline layer 140 from the second trench 114 while leaving the polycrystalline layer 140 in the first trench 114, wherein the polycrystalline layer 140 remaining in the first trench 114 forms the first gate electrode 141. The first gate dielectric 131 which is not covered by the first gate electrode 141 is removed.

Figure 1D:
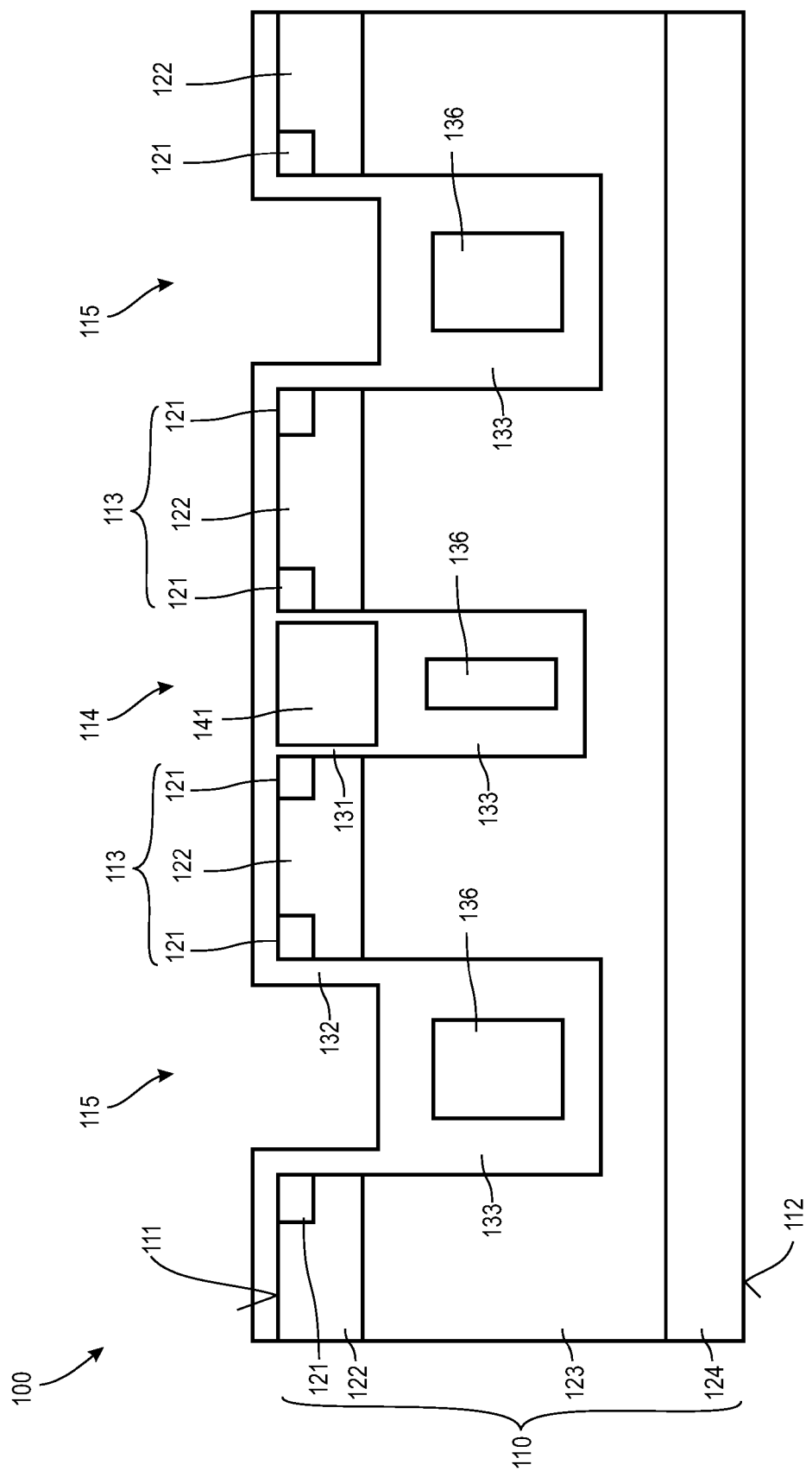

With reference to FIG. 1D, further processes are described which includes forming a second gate dielectric 132 at least in the second trench 115. Typically, the second gate dielectric 132 is formed by thermal oxidation of those portions of the semiconductor substrate 110 which are exposed after removal of the polysilicon layer 140 and the first gate dielectric 131. As the upper portion of the polysilicon layer 140 is also exposed, this upper portion is also subjected to the thermal oxidation process.

The thermal oxidation process to form the second gate dielectric 132 (second thermal oxidation process) is different to the thermal oxidation process of forming the first gate dielectric 131 (first thermal oxidation process). For example, the second thermal oxidation process can be longer and/or conducted at a higher temperature than the first thermal oxidation process. As an illustrative example, the temperature for both oxidation processes can be the same, for example between 850° C. to 1150° C., and the duration of the first thermal oxidation process can be shorter than the duration of the second thermal oxidation process for the second dielectric 132. When the second thermal oxidation process is longer than the first thermal oxidation process, the second gate dielectric 132 is provided with a second thickness which is larger than the first thickness of the first gate dielectric 131. For example, the second thickness of the second gate dielectric 132 can be between 10 nm and 80 nm. The second field-effect structure 152 thus has a higher threshold voltage than the first field-effect structure 151 due to the thicker second gate dielectric 132.

The first gate dielectric 131 is thus formed in the first and second trench 114, 115 prior to depositing the polycrystalline layer 140, wherein the first gate dielectric 131 is removed from the second trench 115 after isotropic etching of the polycrystalline layer 140 and before forming the second gate dielectric 132.

Figure 1E:
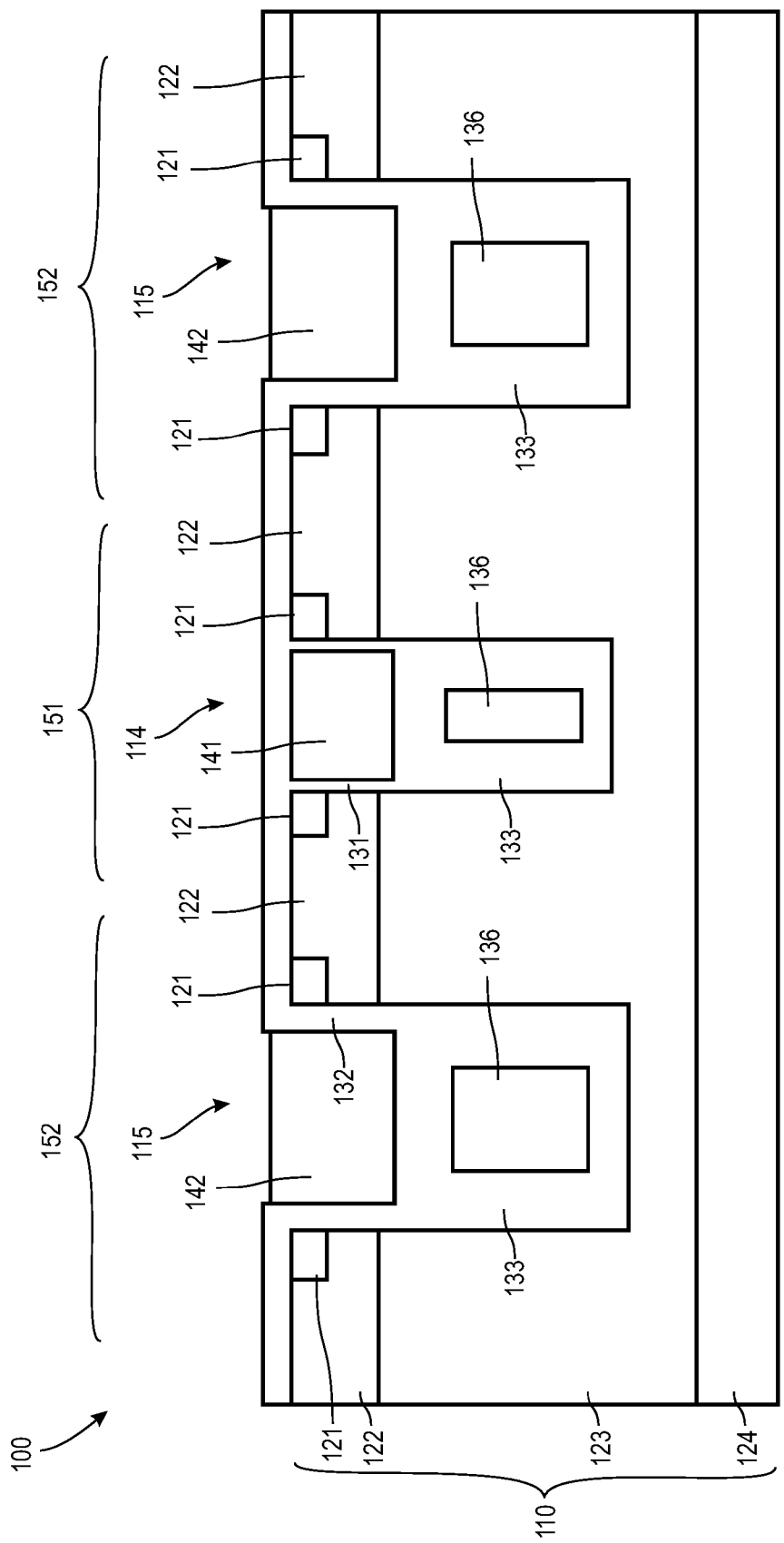

As illustrated in FIG. 1E, a metallic material is deposited into the second trench 115 to form a second gate electrode 142 in the second trench 115. The metallic material can be selected from at least one of a metal, a metal alloy, a metal layer stack, a metal alloy layer stack and a combination thereof. The metallic material can be deposited using, for example, a physical vapour deposition (PVD) process. PVD processes allow a good filling of the second trench 115.

For example, tungsten (W) can be deposited with an optional initial liner of titanium (Ti) and/or titanium nitride (TiN). A Ti/TiN liner improves adhesion of the W material which forms the bulk material of the second gate electrode 142. The second gate electrode 142 can thus be a metal stack.

The metallic material can be deposited first as a layer followed by a subsequent anisotropic etching process or a CMP process to remove the metallic material from the first side 111 of the semiconductor substrate 110 except from the second trench 115 which remains filled with the metallic material.

As is described further below, the second gate electrode 142 is electrically insulated from the semiconductor substrate 110, particularly from the source region 121 and the body region 122. Furthermore, no other electrical connection is formed between the second gate electrode 142 and the source region 121 and/or the body region 122 to allow applying an electrical potential to the second gate electrode 142 which is different to the electrical potential applied to the source region 121 and/or the body region 122.

FIG. 1E thus illustrates processes of forming a second gate electrode 142 on and in contact with a second gate dielectric 132 of a second field-effect structure 152, wherein the second gate dielectric 132 is arranged between the second gate electrode 142 and the semiconductor substrate 110. The second gate electrode 142 is comprised of one of a metal, a metal alloy, a metal layer stack, a metal alloy layer stack and a combination thereof, and is electrically insulated from the semiconductor substrate 110, particularly from the source region 121 and the body region 122.

In an alternative process sequence, the second gate dielectric 132 and the second gate electrode 142 can be formed first followed by the formation of the first gate dielectric 131 and the first gate electrode 141. The processes of FIGS. 1D and 1E will then be performed before the formation of the first gate dielectric in FIG. 1A and the processes of FIGS. 1B and 1C.

The processes illustrated in FIGS. 1A to 1E can be modified to form the source region 121 and the body region 122 after the formation of the first and/or second gate dielectric 131, 132. It would also be possible to form first the source region 121 and the body region 122 after the formation of the second gate electrode 142. However, formation of the source region 121 and the body region 122 prior to the formation of the first and second gate dielectrics 131, 132 is beneficial as the formation of the source region 121 and the body region 122 includes thermal processes which may affect other structures such as the gate thickness of the gate dielectrics.

Figure 1F:
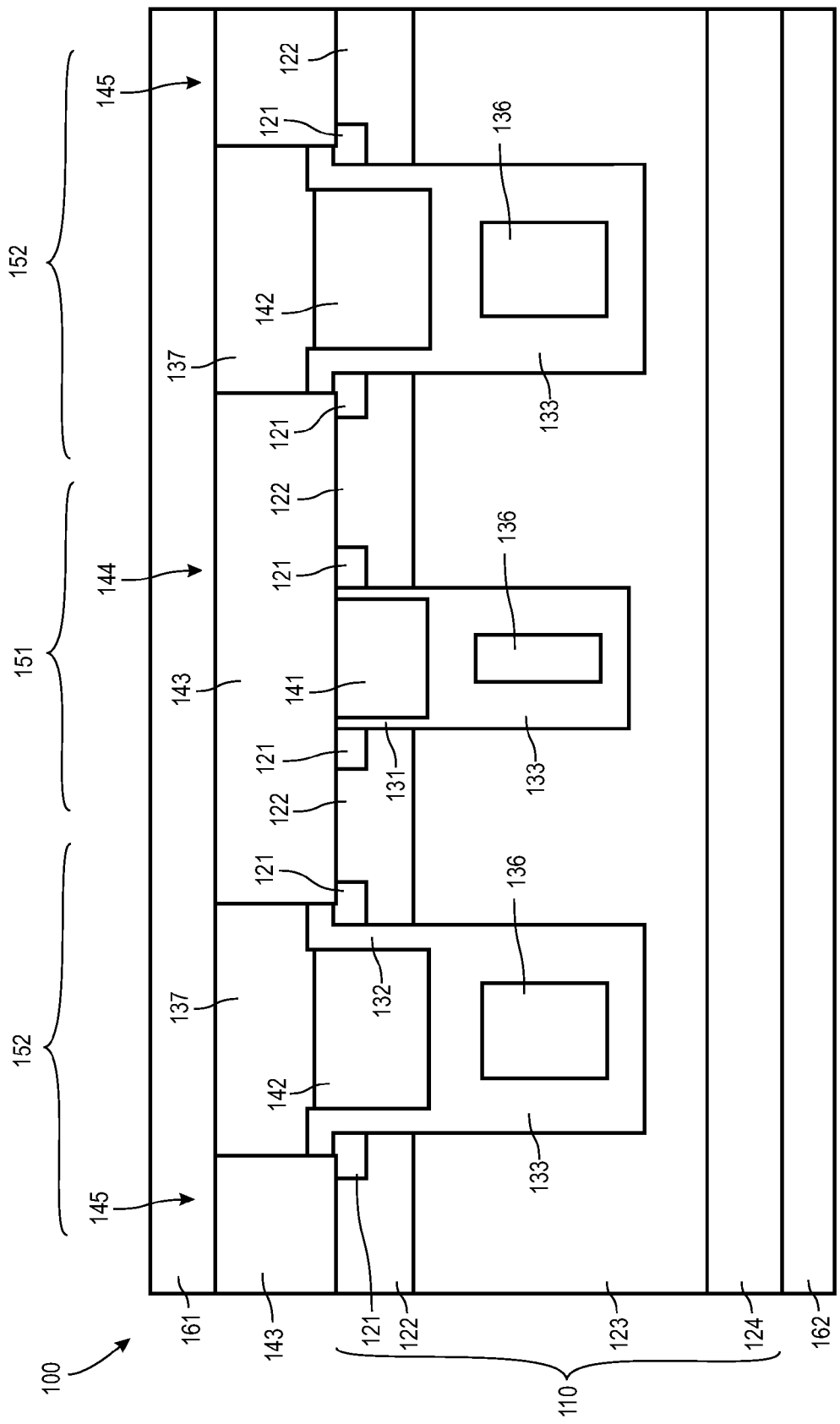

In further processes, as illustrated in FIG. 1F, an insulating layer 137, for example a thick silicon oxide layer, is formed. Openings 144, 145 are formed in the insulating layer 137 to provide access to the source regions 121, the body regions 122, and the first gate electrode 141 while the second gate electrode 142 remains covered by the insulating layer 137. The openings 144, 145 thus at least partially expose the mesa regions 113 between the trenches 114, 115.

As illustrated in FIG. 1F, the opening 144 exposing the first gate electrode 141 also exposes adjacent portions of the mesa regions 113 next to the first trench 114. The opening 144 thus provides access to the first gate electrode 141 and the respective adjacent source region 121 and the body region 122 which form, together with the first gate electrode 141 and the first gate dielectric 131, the first field-effect structure 151.

The opening 145 merely exposes portions of the mesa regions 113 adjacent to the second trench 115 without exposing the second gate electrode 142. The opening 145 thus only provides access to the source region 121 adjacent to the second gate electrode 142 and the body region 122 which form together with the second gate dielectric 132 and the second gate electrode 142 the second field-effect structure 152.

In a further process, as illustrated in FIG. 1F, the openings 144, 145 are filled with a conductive material to form source contacts 143. The material of the source contacts 143 can be, for example, a metal, a metal alloy, a metal layer stack, a metal alloy layer stack and a combination thereof, and can be, for example, of the same material as for the second gate electrode 142.

The source contact 143 formed in the opening 144 thus provides an ohmic connection between the first gate electrode 141 and the source region 121 and the body region 122. The second gate electrode 142 remains electrically insulated from the respective source and body regions 121, 122.

In further processes, a source metallization 161 is formed on the insulating layer 137 and in ohmic contact with the source contacts 143. Furthermore, a drain metallization 162 is formed on the second side 112 of the semiconductor substrate 110 on and in ohmic contact with the drain region 124.

FIG. 1F thus illustrates process of forming an electrical connection between the first gate electrode 141 and the n-doped source region 121 of the first field-effect structure 151.

The above processes thus leads to the formation of a semiconductor device 100 having a polysilicon gate, formed by the first gate electrode 141, on and in contact with a thin gate dielectric, formed by the first gate dielectric 131, and a metal gate, formed by the second gate electrode 142, on and in contact with the thick gate dielectric, formed by the second gate dielectric 132.

The electrical resistance of the second gate electrode 142 can be kept small as a metal or a metal alloy having a low electrical resistance in comparison to highly doped polysilicon is used as material for the second gate electrode 142. As the second gate electrode 142, which can extend as a long buried gate bus in the second trench 115, also forms the electrical connection to a gate runner or other conductive structures arranged in the periphery of the semiconductor device 100, the resistance of these gate electrode structures and the total gate resistance for each second field-effect structure 152 cell can be kept small even when the size of the second trench 115 is reduced due to an overall pitch-shrink.

Using metal for the first gate electrode 141 would be in principle also possible. However, depositing metal on the comparably thin first gate dielectric 131 may cause problems as the deposited metal can diffuse or migrate through the thin first gate dielectric 131. The first gate electrode 141 is therefore formed of polysilicon to avoid these problems. The reliability of the thin first gate dielectric 131 is not affected by a metal. Metal may also diffuse in the second gate dielectric 132. This is, however, tolerable as the second gate dielectric 132 is thicker than the first gate dielectric 131.

Furthermore, as the first gate electrode 141 is directly connected to the source contact 143 and to the source region 121, there is no long and thin conductive structure which would increase the gate resistance of the first field-electrode structure 151.

The semiconductor device 100 as illustrated in FIG. 1F is a power semiconductor device and includes a power FET without being limited thereto. The semiconductor device 100 typically includes a plurality of second field-effect structures 152 each forming a respective transistor cell of the power FET. In addition to that, the semiconductor device 100 includes a plurality of first field-effect structures 151 each forming a respective MOS-gated diode. The second field-effect structures 152 form a three-terminal device having separate terminals for the gate, source and drain, while the first field-effect structures 151 form a two-terminal device having a common terminal for the gate and the source and a separate terminal for the drain.

The semiconductor device 100 thus includes the semiconductor substrate 110 and at least the first field-effect structure 151 integrated in the semiconductor substrate 110, wherein the first field-effect structure 151 includes the first gate electrode 141 on and in contact with the first gate dielectric 131 which is arranged between the first gate electrode 141 and the semiconductor substrate 110. The first gate electrode 141 is of a polycrystalline semiconductor material. The semiconductor device 100 further includes at least a second field-effect structure 152 integrated in the semiconductor substrate 110, wherein the second field-effect structure 152 includes a second gate electrode 142 on and in contact with a second gate dielectric 132 which is arranged between the second gate electrode 142 and the semiconductor substrate 110. The second gate electrode 142 is of one of a metal, a metal alloy, a metal layer stack, a metal alloy layer stack and a combination thereof, and is electrically insulated from the semiconductor substrate.

According to an embodiment, the first field-effect structure 151 is a MOS-gated diode having a p-doped body region 122 and an n-doped source region 121 formed in the semiconductor substrate 110, wherein the first gate electrode 141 is in ohmic contact with the source region 121 of the semiconductor substrate 110. The second field-effect structure 152 is a field-effect transistor including a p-doped body region 122 and an n-doped source region 121 formed in the semiconductor substrate 110, wherein the second gate electrode 142 is electrically insulated from the body region 122 and the source region 121 of the second field-effect structure 152.

The doping relations can also be reversed so that the source regions 121, the drift region 123 and the drain region are p-doped, and that the body region is n-doped.

With reference to FIGS. 2A to 2H, a further embodiment of a method for manufacturing a semiconductor device is described. This embodiment includes formation of a semiconductor device 200 having a first field-effect structure 251 with a polysilicon gate 241 and a second field-effect structure 252 with a metal gate 242. The method employs a mask for forming the polysilicon gate 241 selective to the metal gate 242.

Figure 2A:
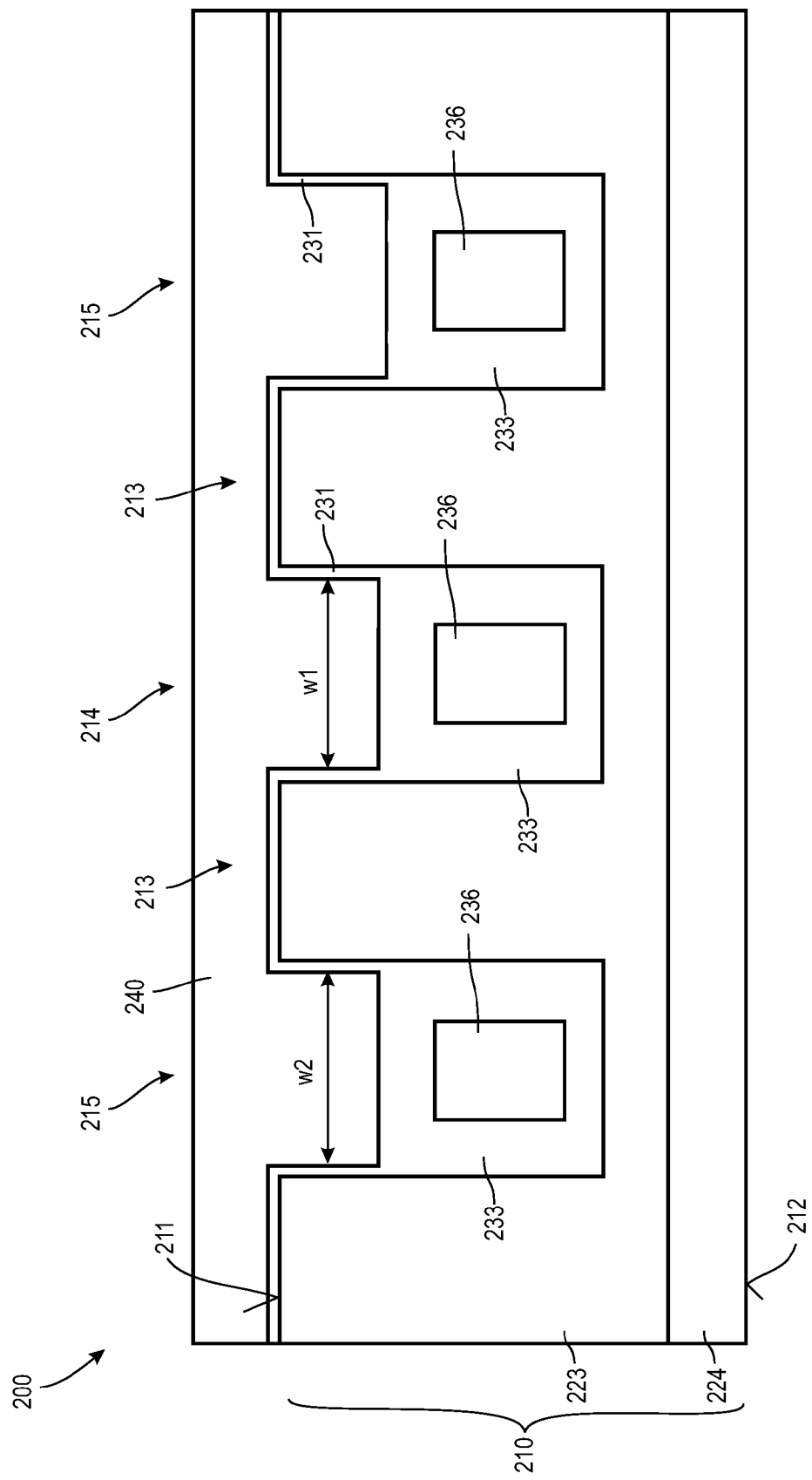
FIGS. 2A to 2H illustrate processes of a method for manufacturing a semiconductor device according to an embodiment.

As illustrated in FIG. 2A, a semiconductor substrate 210 having a first side 211 and a second side 212 opposite the first side 211 is provided. The same semiconductor materials as described in connection with FIGS. 1A to 1F can be used. Furthermore, the semiconductor substrate 210 can include a monolithic body 224, which later forms the drain region 224 of the semiconductor device 200, and a weakly n-doped epitaxial layer 223 as described in connection with FIGS. 1A to 1F. Different to the embodiment of FIGS. 1A to 1F, body regions 222 and source regions 221 are formed later but can also be formed at earlier stages as described in connection with FIGS. 1A to 1F.

First and second trenches 214, 215 are formed as described above with the difference, that the first thickness w1 and the second thickness w2 are equal. It is also possible that the first thickness w1 and the second w2 are different. As a photolithographic mask is later used to selectively remove the polysilicon layer, the first and second thickness w1, w2 can be selected independently from each other. Mesa regions 213 remain between adjacent trenches 214, 215 as described above.

A field oxide 233 and a field electrode 236 is formed in each of the first and second trenches 214, 215 as described in connection with FIGS. 1A to 1F. Furthermore, a first gate dielectric 231 is formed as described above.

As further illustrated in FIG. 2A, a polycrystalline layer 240 of a polycrystalline semiconductor material is deposited to fill the first and second trenches 214, 215. The same processes as described for the polycrystalline layer 140 can be used. In the following, the polycrystalline layer 240 is therefore referred to as polysilicon layer 240.

FIG. 2A thus illustrates processes of providing a semiconductor substrate 210 having a first side 211, of forming the first gate dielectric 231 on the first side 211 of the semiconductor substrate 210, and of depositing a polycrystalline layer 240 of a polycrystalline semiconductor material on the first gate dielectric 231, particularly of depositing the polycrystalline layer 240 at least in the first and second trench 214, 215.

Figure 2B:
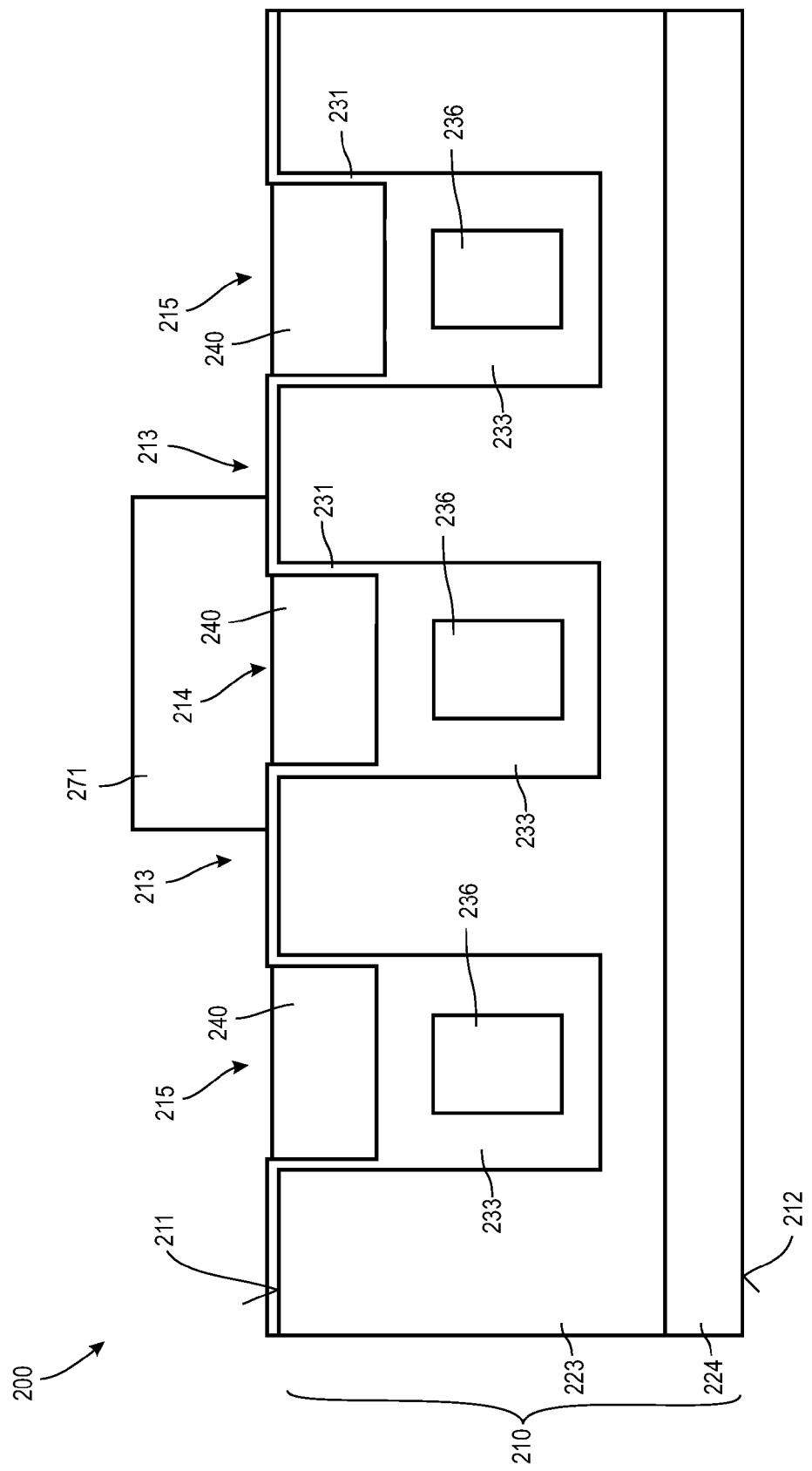

As illustrated in FIG. 2B, the polysilicon layer 240 is globally etched back, or subjected to chemical-mechanical polishing, to remove the polysilicon layer 240 from the mesa regions 213. The trenches 214, 215 remain filled with the material of the polysilicon layer 240. The first gate dielectric 231 can also serve here as an optical etch stop as described above.

FIG. 2B further illustrates a process of forming a mask 271 on the etched or back-polished polysilicon layer 240 to cover a portion of the polysilicon layer 240 (polycrystalline layer 240) which is arranged in the first trench 214. Portions of the polysilicon layer 240 which are arranged in the second trench 215 are not covered by the mask 271. The mask 271 can be, for example, a hard mask which allows etching of the material of the polysilicon layer 240 relative to the material of the mask 271. Furthermore, the mask 271 can also be used to remove the first gate dielectric 231 from portions not covered by the mask 271. The material of the mask 271 can therefore be selected to allow this selective removal. The mask 271 can be, for example, made of silicon nitride, or also of silicon oxide, or a polymer mask.

FIG. 2B thus illustrates processes of forming a mask 271 on the polysilicon layer 240 to cover the polysilicon layer 240 in the first trench 214 while leaving the polycrystalline layer 240 in the second trench 215 uncovered.

The polysilicon layer 240 is subsequently etched, typically by an anisotropic etching process, using the mask 271 as etching mask to remove the polysilicon layer 240 from regions which are not covered by the mask 271. The etching can also be carried out selective to the material of the first gate dielectric 231. The portions of the polysilicon layer 240 which remain in the first trench 214 on the first gate dielectric 231 forms the first gate electrode 241.

Figure 2C:
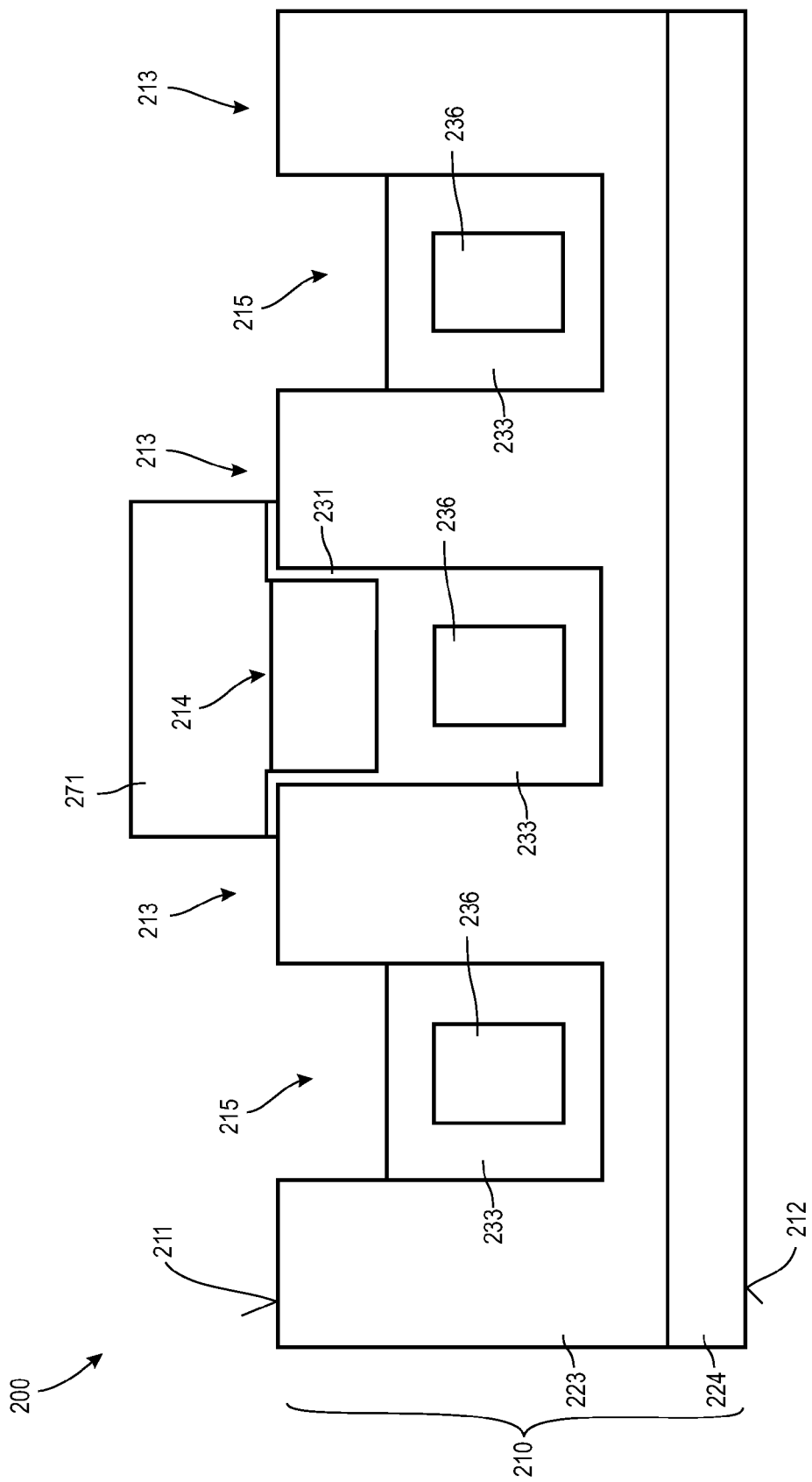

As illustrated in FIG. 2C, the first gate dielectric 231 is etched selective to the mask 271 to remove the portions of the first gate dielectric 231 which are not covered by the mask 271. The first gate dielectric 231 is particularly removed from the second trench 215. An alternative process is illustrated in FIG. 2F where the mask 271 is removed prior to removing the first gate dielectric 231 so that the first gate dielectric 231 is removed from portions of the semiconductor substrate 210 which are not covered by the first gate electrode 241.

FIG. 2C thus illustrates processes of etching the polysilicon layer 240 using the mask 271 as etching mask to remove the polysilicon layer 240 from the second trench 215, wherein the portion of the polysilicon layer 240 remaining in the first trench 214 forms the first gate electrode 241.

Figure 2D:
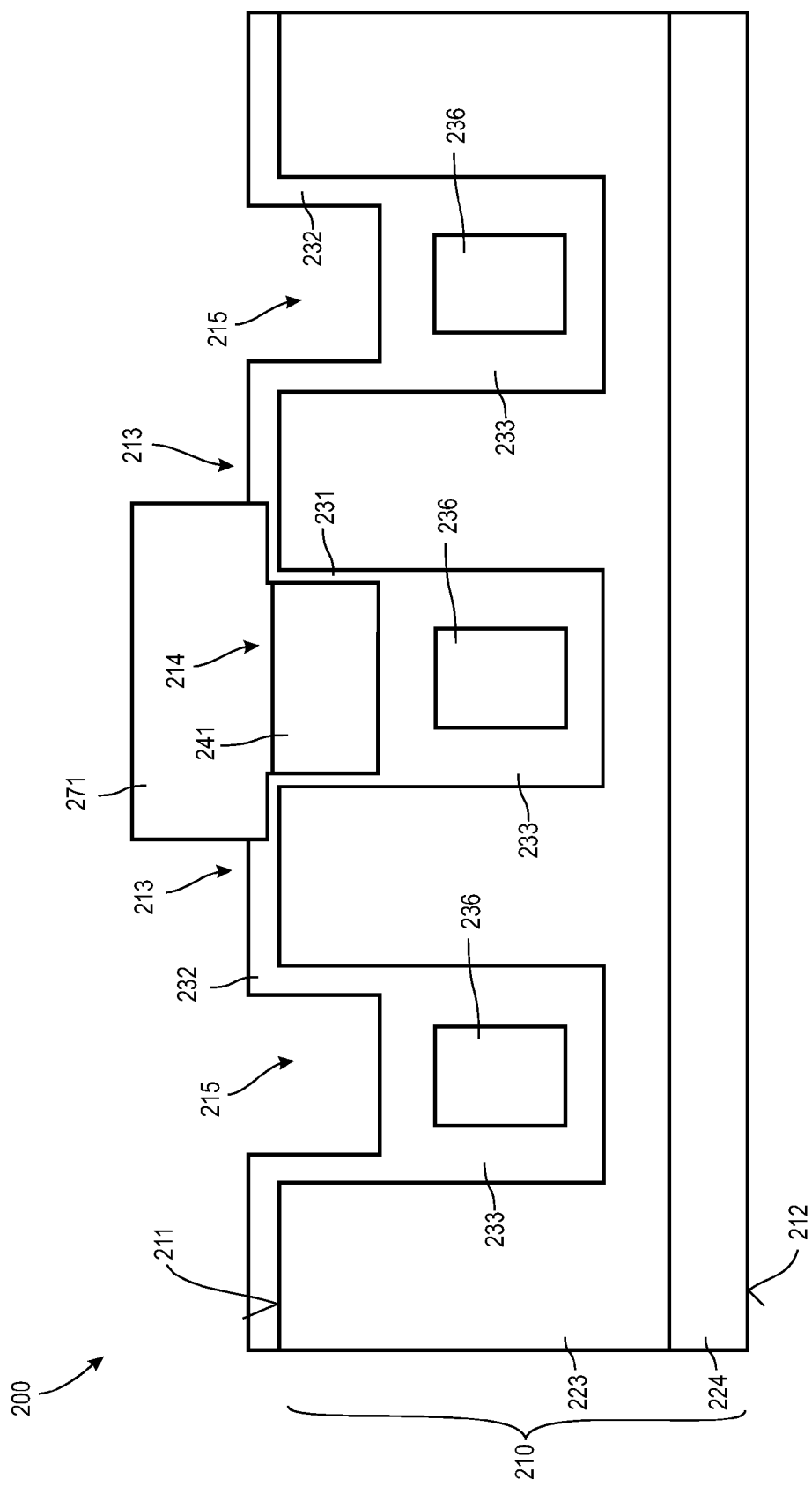

In a further process, as illustrated in FIG. 2D, a second gate dielectric 232 is formed on the first side 211 of the semiconductor substrate 210, particularly in the second trench 215. Typically, the second gate dielectric 232 is formed by thermal oxidation in a process different to the process for forming the first gate dielectric 231. Furthermore, the second gate dielectric 232 can have a second thickness in the range given above while the first gate dielectric 231 can have a first thickness in the range given above.

Figure 2E:
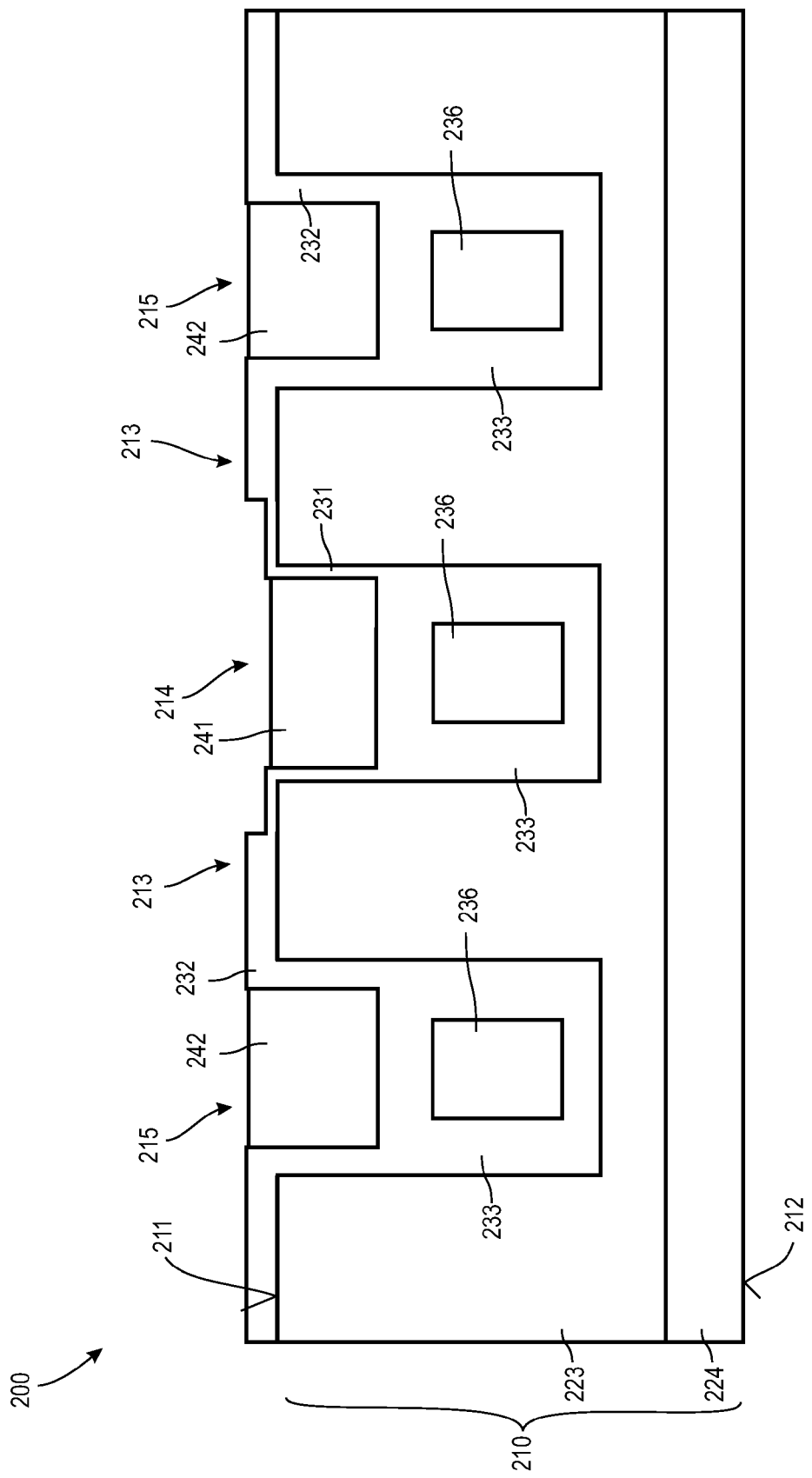
Figure 2F:
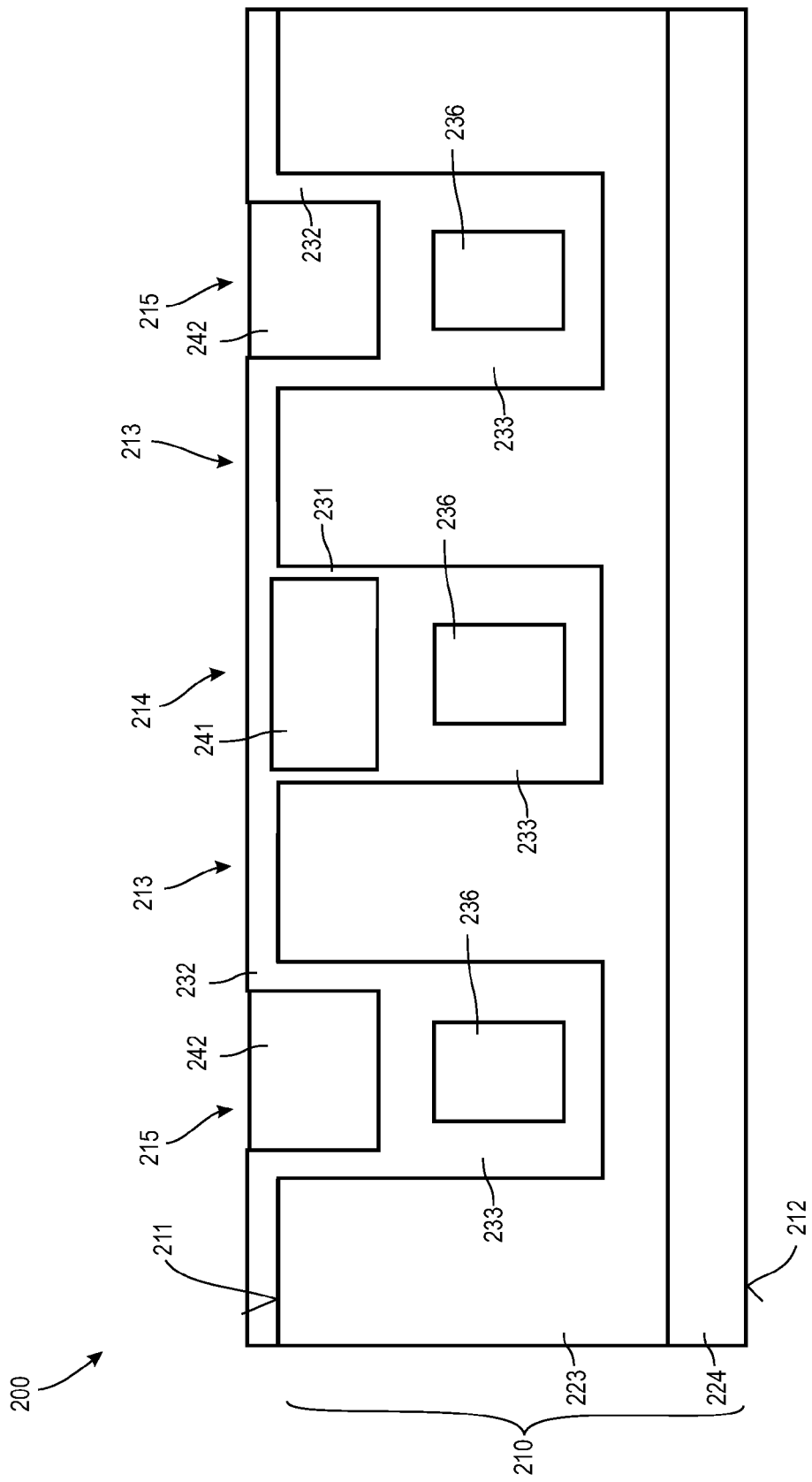

As illustrated in FIG. 2D, mask 271 remains in place during formation of the second gate dielectric 232 which leads to a step between the first and second gate dielectric 231, 232 as illustrated in FIGS. 2D and 2E. FIG. 2E illustrates the semiconductor device 200 after removal of the mask 271. In a variation, the mask 271 is removed prior to forming the second gate dielectric 232.

FIG. 2F illustrates the semiconductor device 200 after formation of the second gate dielectric 232 without the mask 271. The mask 271 can either be removed after the processes of FIG. 2B or FIG. 2C. When the second gate dielectric 232 is formed after prior removal of the mask 271, no step between the first and second dielectric layer 231, 232 is formed as illustrated in FIG. 2F.

FIGS. 2D to 2F thus illustrates processes of forming the second gate dielectric 232 at least in the second trench 215. More specifically, FIGS. 2A to 2F illustrates processes of forming the first gate dielectric 231 in the first and second trench 214, 215 prior to depositing the polysilicon layer 240, and of removing the first gate dielectric 231 using at least one of the mask 271 and the etched polycrystalline layer 240 as etching mask after anisotropic etching the polycrystalline layer 240 and before forming the second gate dielectric 232.

FIGS. 2E and 2F further illustrates the formation of the second gate electrode 242 by processes as described in connection with FIGS. 1A to 1F. Specifically, a metallic material such as a metal, a metal alloy, a metal layer stack, a metal alloy layer stack and a combination thereof is deposited on the second gate dielectric 232, particularly in the second trench 215, to form the second gate electrode 242. Typically, the metallic material is globally deposited as a layer, for example by a PVD process, and then etched back so that the metal only remains in the second trenches 215.

Figure 2G:
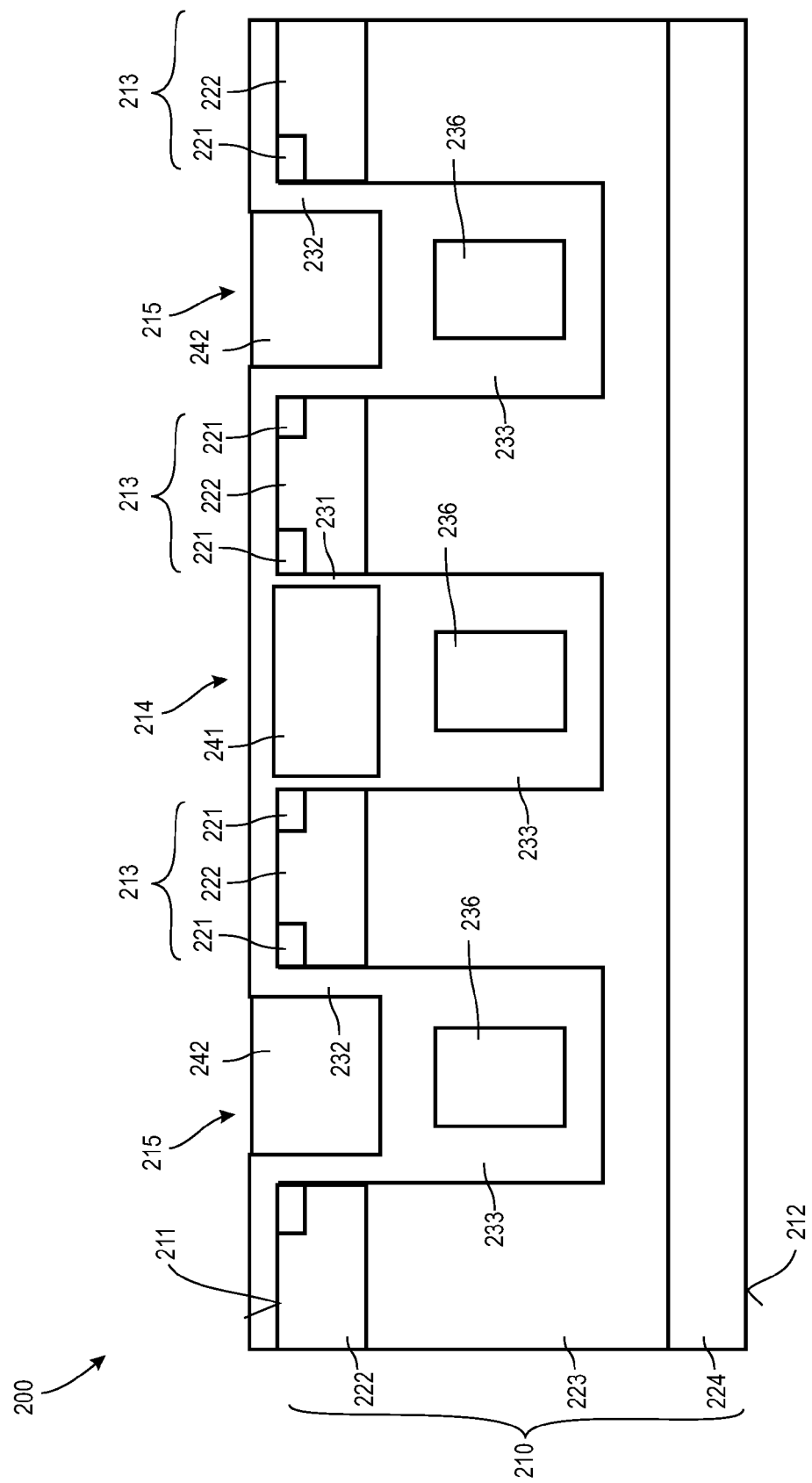

Further processes are illustrated in FIG. 2G which includes formation of body region 222 and source regions 221 by implantation as described in connection with the FIGS. 1A to 1F. The body and source regions 222, 221 can also be formed prior to formation of the first gate dielectric 231.

Furthermore, the order of the formation of the first and second gate dielectric 231, 232 can also be reversed so that the second gate dielectric 232 and the second gate electrode 242 are formed first followed by the formation of the first gate dielectric 231 and the first gate electrode 241.

Figure 2H:
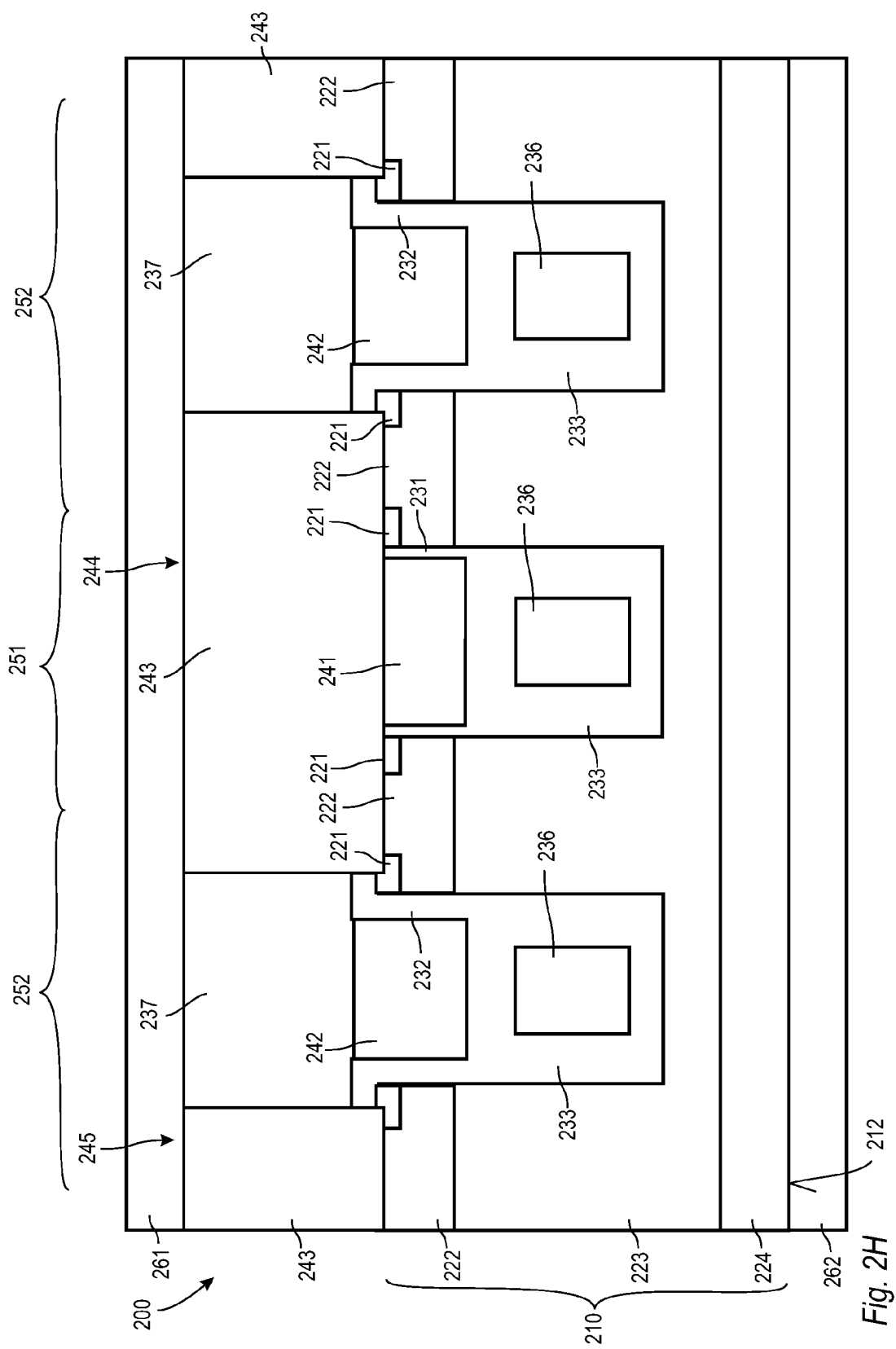

Additional processes are illustrated in FIG. 2H which includes formation of an insulating layer 237, openings 244, 245 in the insulating layer 237, and of source contacts 243 in the openings 244, 245 as described in connection with FIGS. 1A to 1F. The source contact 243 in the openings 244 provides an electrical connection between the first gate electrode 241 and the source region 221 and the body region 222 which form together with the respectively adjacent first gate electrode 241 and the first gate dielectric 231 the first field-effect structure 251. Different thereto, the source contact 243 formed in the opening 245 contacts only the source region 221 and the body region 222 which form together with the respectively adjacent second gate dielectric 232 and second gate electrode 242 the second field-effect structure 252. The second gate electrode 242 is not in electrical connection with the source contact 243.

Furthermore, a source metallization 261 and a drain metallization 262 are formed as described in connection with FIG. 1F.

FIG. 2H thus illustrates a semiconductor device 200 with a first field-effect structure 251 which is a MOS-gated diode having a p-doped body region 222 and an n-doped source region 221 formed in the semiconductor substrate 210, wherein the first gate electrode 241 is in ohmic contact with the source region 221 of the semiconductor substrate 210. The semiconductor device 200 further includes a second field-effect structure 252 which is a field-effect transistor having a p-doped body region 222 and an n-doped source region 221 formed in the semiconductor substrate 210, wherein the second gate electrode 242 is electrically insulated from the body region 222 and the source region 221 of the second field-effect structure 252. The first and second field-effect structures 251, 252 are n-channel devices since n-channels are formed in the body region 222 between the drift region 223 and the source region 221 along the respective gate dielectrics 231, 232 when a positive voltage is applied to the respective gate electrodes 241, 242. The thresholds at which the respective n-channels are formed depend on the thickness of the respective gate dielectrics 231, 232, the material of the gate dielectrics 231, 232, and of the doping concentration of the body region or regions 222.

Figure 3:
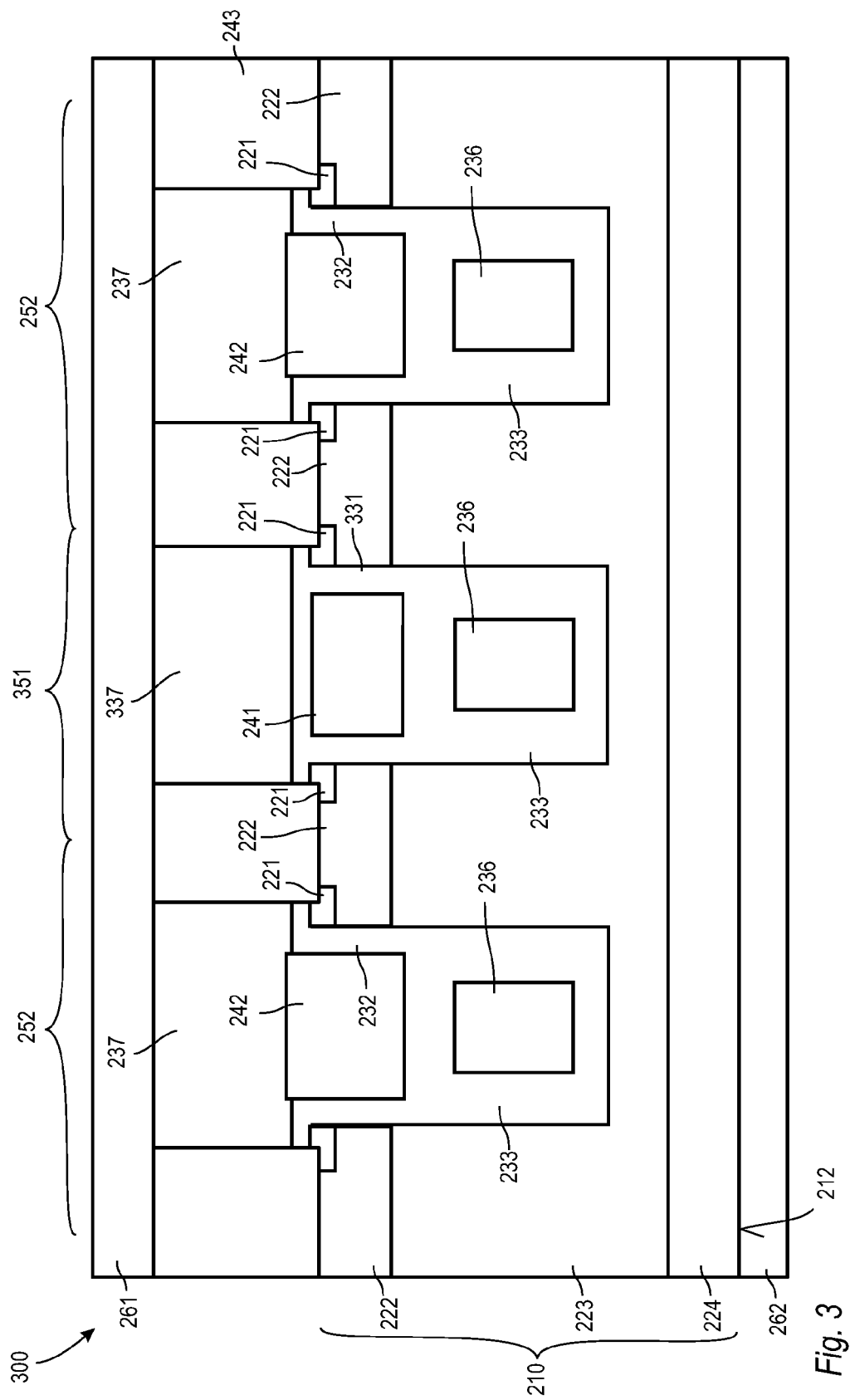
FIG. 3 illustrates a semiconductor device according to an embodiment.

FIG. 3 illustrates a further embodiment of a semiconductor device 300 which can be manufactured with any of the processes described in FIGS. 1A to 1F and 2A to 2H. Different to the semiconductor devices 100 and 200 of FIGS. 1F and 2H, the first gate electrode 241 is not electrically connected to the source region 221 and the body region 222 of the first field-effect structure 351. The first gate electrode 241 is therefore not electrically connected with the source metallization 261.

Furthermore, the first gate dielectric 331 has the same thickness as the second gate dielectric 232. The first and second dielectrics 331, 232 can also have the thickness relation as described above. The first field-effect structure 351 is in this embodiment a field-effect transistor similar to the second field-effect structure 252. More specifically, the semiconductor device 300 includes an n-channel field-effect transistor 351 (first field-effect structure) with a polysilicon gate 241 and an n-channel field-effect transistor 252 (second field-effect structure) with a metal gate 242.

FIG. 3 thus illustrates a semiconductor device 300 wherein each of the first and second field-effect structures 351, 252 includes a p-doped body region 222 and an n-doped source region 221 formed in the semiconductor substrate 210, wherein each of the first and second gate electrodes 241, 242 is electrically insulated from the respective body regions 222 and source regions 221. The gate materials of the first and second gate electrodes 241, 242 are different from each other and can be any of a polysilicon semiconductor material, a metal, metal alloy, a metal layer stack, a metal alloy layer stack, or a combination thereof. The first gate electrodes 241 can be, for example, also a metal or any metal containing material.

The semiconductor devices 100, 200, 300 are three-terminal power semiconductor devices. These devices 100, 200, 300 are typically vertical components having at least one electrode formed by a first metallization (source metallization in the above embodiments) 161, 261 on the first side 111, 211 of the semiconductor substrate 110, 210 and at least another electrode formed by a second metallization (drain metallization in the above embodiments) 162, 262 on the second side 112, 212 of the semiconductor substrate 110, 210.

The first side 111, 211 of the semiconductor substrate 110, 210 can be, for example, the front-side of the semiconductor device, where, for example, the source regions of the FET and/or the MOS-gated diodes are arranged. The second side 112, 212 of the semiconductor substrate 110, 210 can be, for example, the back-side of the semiconductor device, where, for example, the common drain region of the FET and the MOS-gated diode is arranged.

Alternatively, the second field-effect structure of the semiconductor devices 100, 200, 300 can also be transistor cells of an Insulated Gate Bipolar Transistor (IGBT). In this case, the region 124, 224 is a p-doped collector region.

FIGS. 4A to 4G illustrates processes for manufacturing another semiconductor device. This device is referred to as planar device as the transistor cells do not include trenches but so-called double diffused regions. The resulting device is, however, also a vertical device as in the other embodiments.

FIGS. 4A and 4B illustrates two alternative initial processes as suitable starting point.

In both alternatives of FIGS. 4A and 4B, a semiconductor substrate 410 having a first side 411 and a second side 412 is provided as described above.

In the alternative of FIG. 4A, the doping regions 421, 422 and 426 are not formed and will be formed at a later staged.

In the alternative of FIG. 4B, n-doped source regions 421 and p-doped body regions 422 have already been formed by implantation in the semiconductor substrate 410. Furthermore, p-doped compensation regions 426 can also be formed below and in contact with the p-doped body regions 422. Adjacent p-doped compensation regions 426 confine n-doped regions of the drift region 423. The p-doped compensation regions 426 can have a doping concentration lower than the doping concentration of the p-doped body regions 422. Due to the thermal budget consideration, typically source regions 421, body regions 422 and compensation regions 426 are formed prior to the subsequent process described below. Hence, the alternative of FIG. 4B is typically used.

In a further process, which is common to both alternatives of FIGS. 4A and 4B, a first gate dielectric 431 is formed on the first side 411, for example by thermal oxidation. Then a polysilicon layer 440 is formed on the first gate dielectric 431, followed by forming a mask 472 which covers regions of the polysilicon layer 440 where the first gate electrode is to be formed. The polysilicon layer 440 forms the polycrystalline semiconductor material, which can be in-situ doped during deposition or which can be doped after deposition in a separate implantation process.

Figure 4C:
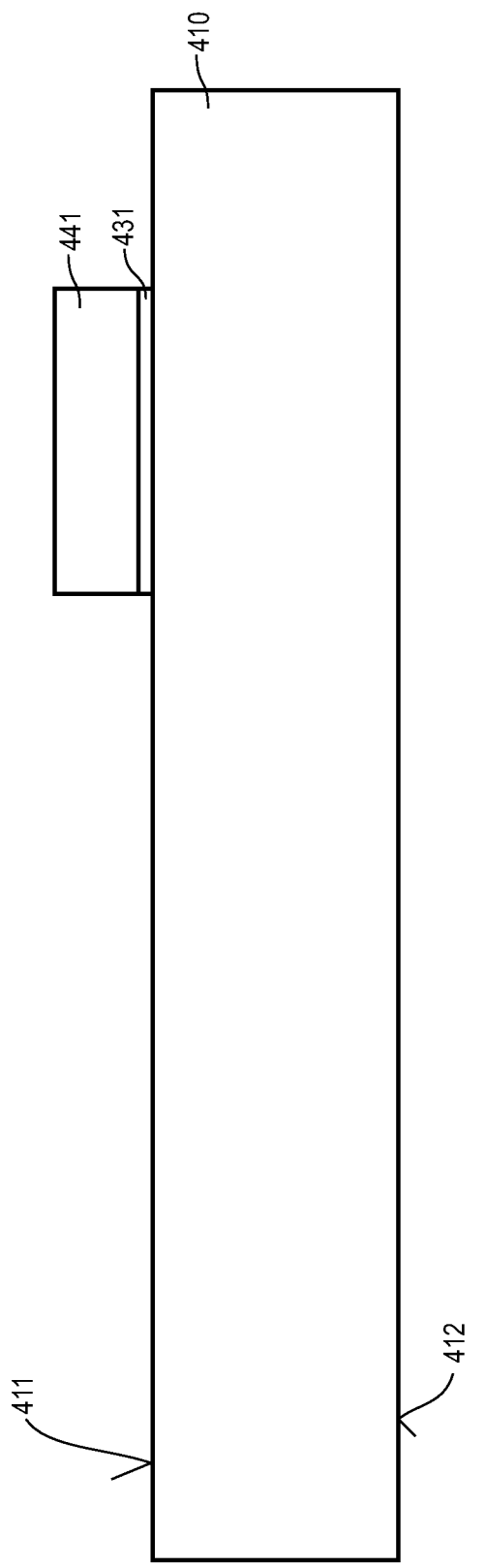

The following FIGS. 4C to 4G illustrate the alternative of FIG. 4A. It is, however noted, that the following processes also apply for the alternative of FIG. 4B.

The mask 472 leaves regions of the polysilicon layer 440 outside of regions exposed, where the first gate electrode is formed. As illustrated in FIG. 4C, the mask 472 is used as etching mask when etching the polysilicon layer 440 to form the first gate electrode 441. Furthermore, the first gate dielectric 431 is etched using the mask 472, or if the mask 472 has already been removed, the first gate electrode 441 is used as etching mask to etch the first gate dielectric 431.

Figure 4D:
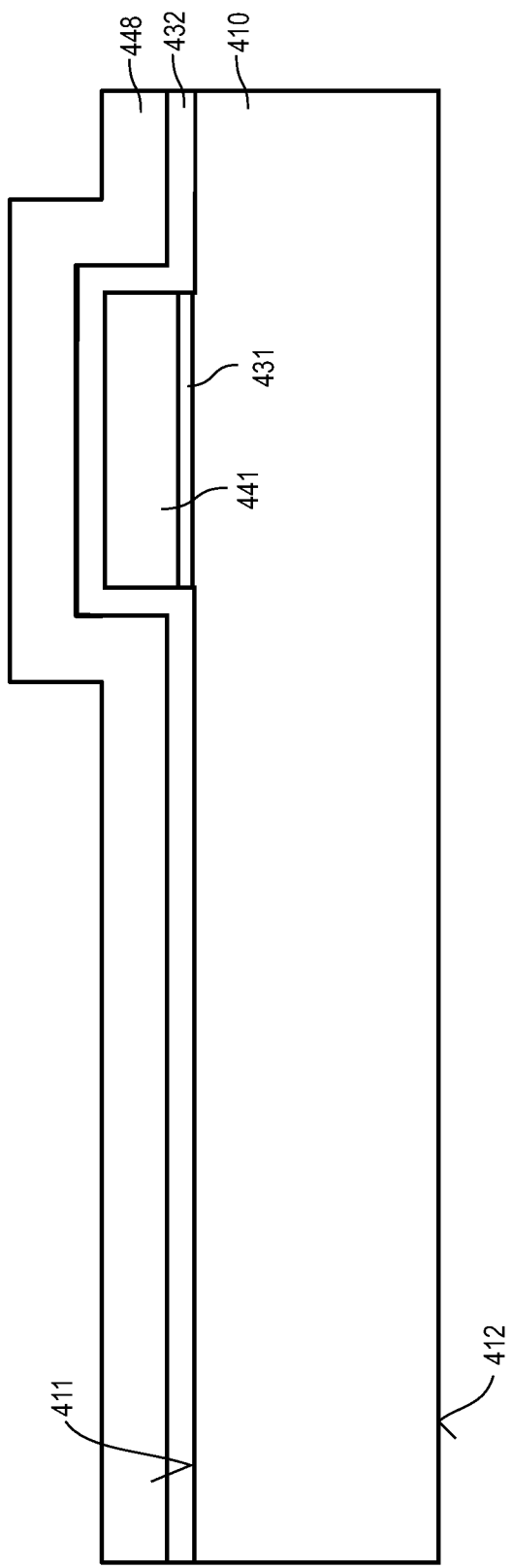

FIG. 4D illustrates further processes which include formation of the second gate dielectric 432, for example by thermal oxidation, followed by deposition of a metal layer or metal-containing layer 448. The second gate dielectric 432 can have a larger thickness than the first gate dielectric 431 as described above, but can also have substantially the same thickness.

The metal layer 448 can be of any metal, metal alloy, or metal layer stack as described above, for example a Ti/TiN/W layer stack.

Figure 4E:
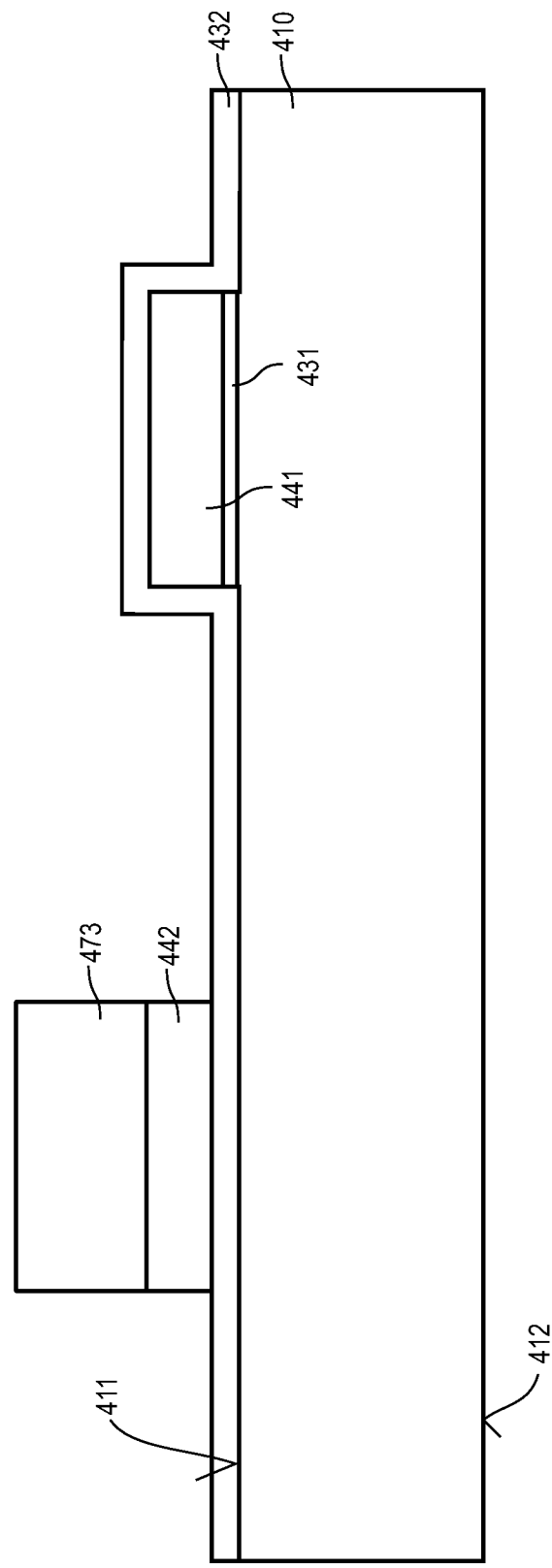

In a further process as illustrated in FIG. 4E, a mask 473 is formed on the metal layer 448. The mask 473 defines the location and size of the second gate electrode 442 which is formed by etching the metal layer 448 using the mask 473 as etching mask.

Figure 4F:
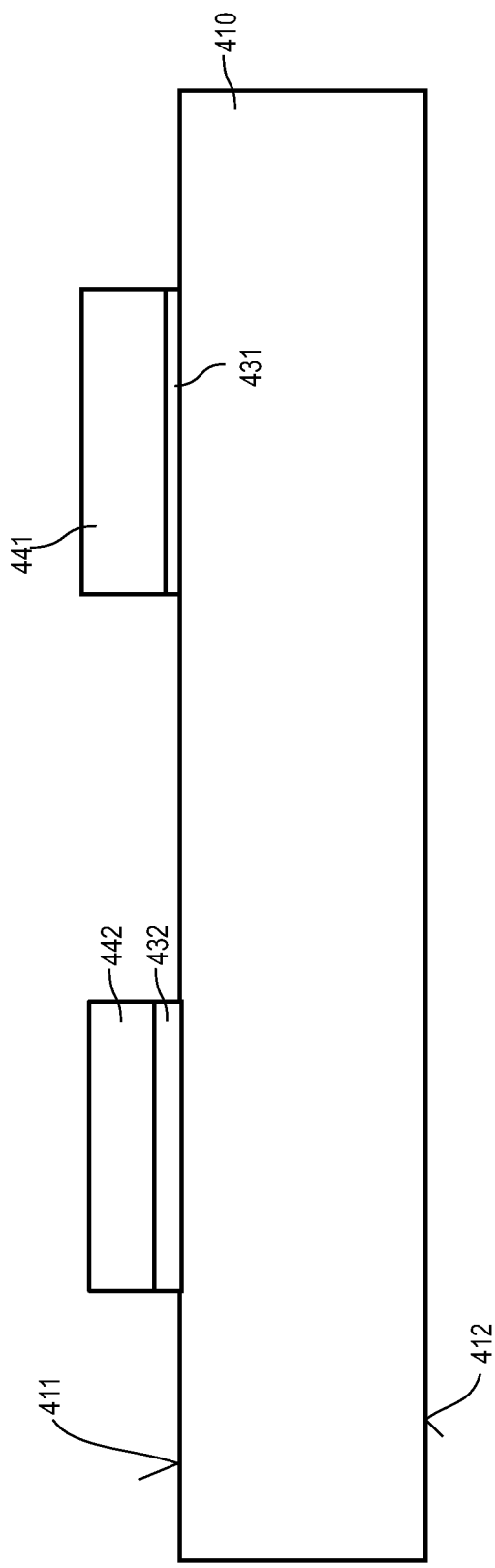

In a further process, as illustrated in FIG. 4F, the second gate dielectric 432 is removed from regions outside the second gate electrode 442. However, this process can be omitted and the second gate dielectric 432 can be left unetched.

In an alternative process sequence, the second gate dielectric 432 and the second gate electrode 442 can be formed before forming the first gate dielectric 431 and the first gate electrode 441.

Figure 4G:
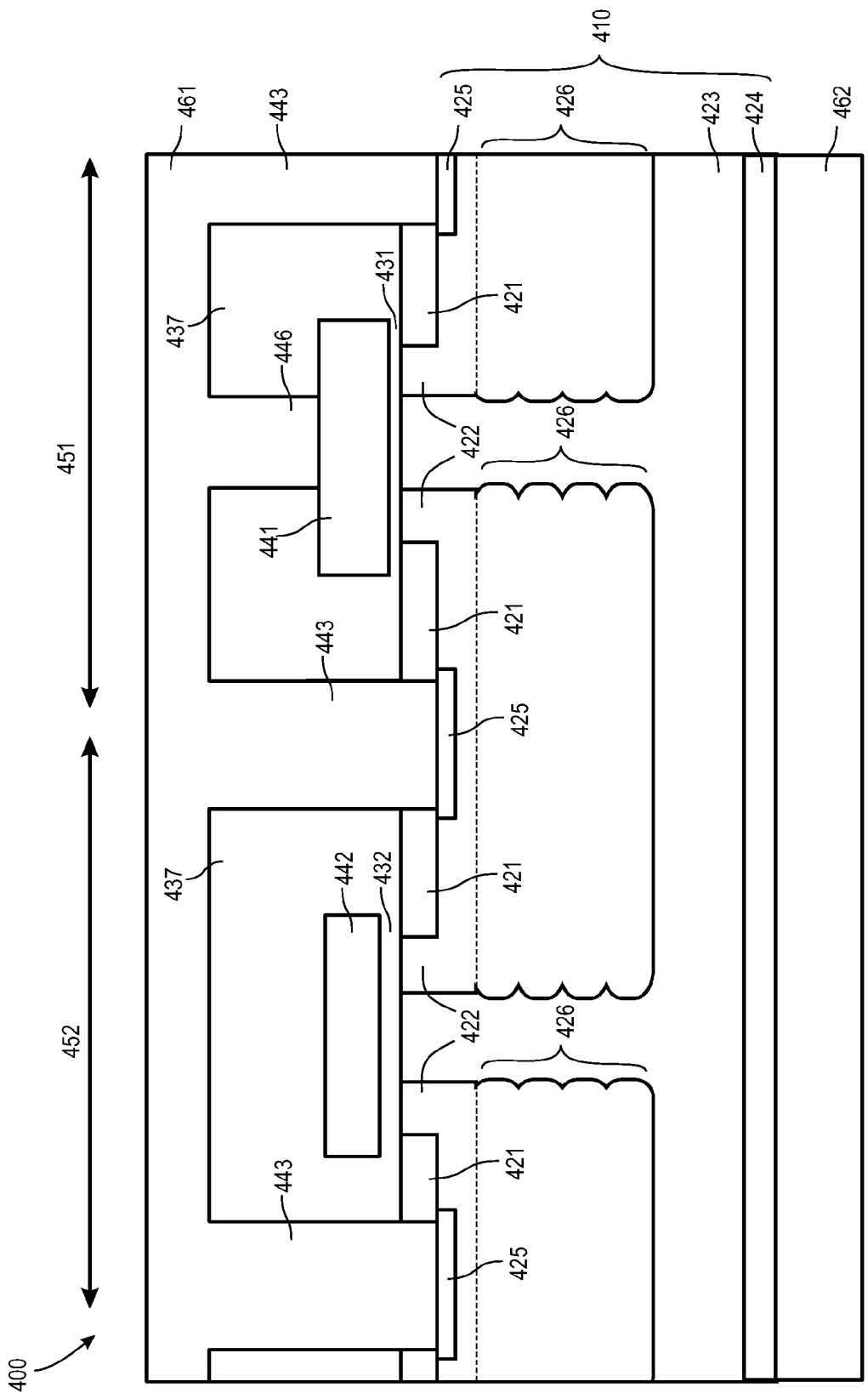

In final processes, as illustrated in FIG. 4G, n-doped source regions 421 and p-doped body regions 422 are formed by implantation. Furthermore, p-doped compensation regions 426 formed below and in contact with the p-doped body regions 422 can also be formed. Adjacent p-doped compensation regions 426 confines n-doped regions of the drift region 423. These confined regions will be completely depleted when the semiconductor device is operated in reverse mode. The p-doped compensation regions 426 can have a doping concentration lower than the doping concentration of the p-doped body regions 422.

Highly p-doped body contact regions 425 are formed to provide good ohmic contact to source and body contacts 443. A source or first metallization 461 is formed on an insulating layer 437 which covers the first and second gate electrodes 441, 442, and which includes openings for the source and body contacts 443, and also for the gate contact 446 which provides electrical connection to the first gate electrode 441 and which electrically connects the first gate electrode 441 with the source regions 421 through the first metallization 461 and the source and body contacts 443.

In an alternative process, the gate contact 446 is not formed and the first gate electrode 441 remains electrically insulated from the source regions 421.

A highly n-doped drain region, or alternatively a highly doped p-emitter region, is formed at the second side 412 of the semiconductor substrate 410. When an n-doped drain region is formed, a FET is formed, which is an example of a unipolar device. When a p-doped emitter region is formed, an IGBT is formed, which is an example of a bipolar device.

A second or drain (emitter) metallization 462 is formed on and in ohmic contact with the n-doped drain region 462 or the p-doped emitter region 462, respectively.

The first gate electrode 441 forms together with the first gate dielectric 431 and the respective source regions 421, body regions 422 and compensation regions 426 the first field-effect structure 451. The second gate electrode 442 forms together with the second gate dielectric 432 and the respective source regions 421, body regions 422 and compensation regions 426 the second field-effect structure 452.

The semiconductor device 400 thus includes first field-effect structure 451 having a polysilicon gate electrode 441 and a second field-effect structure 452 having a metal gate electrode 442. The first gate dielectric 431 can be thinner than the second gate dielectric 432.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise. With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method for manufacturing a semiconductor device, the method comprising:
   providing a semiconductor substrate having a first side;
   forming, at the first side of the semiconductor substrate, a first trench in the semiconductor substrate for a first field-effect structure, the first trench having a first width in a lateral direction and the second trench having a second width in the lateral direction, which is larger than the first width;
   forming a first gate dielectric at least in the first trench;
   depositing a polycrystalline layer of a polycrystalline semiconductor material in the first and second trench;
   isotropic etching the polycrystalline layer to remove the polycrystalline layer from the second trench while leaving the polycrystalline layer in the first trench, the polycrystalline layer remaining in the first trench forming a first gate electrode;
   forming a second gate dielectric at least in the second trench; and
   depositing a metallic material comprising at least one of a metal, a metal alloy, a metal layer stack, a metal alloy layer stack and any combination thereof into the second trench to form a second gate electrode.

2. The method of claim 1, wherein the first gate dielectric has a first thickness and the second gate dielectric has a second thickness, wherein the second thickness is larger than the first thickness.

3. The method of claim 1, wherein the first gate dielectric is formed by a thermal oxidation process which is different to a thermal oxidation process used to form the second gate dielectric.

4. The method of claim 1, wherein the polycrystalline layer has a thickness which is larger than half of the first width of the first trench and which is less than half of the second width of the second trench.

5. The method of claim 1, wherein the first gate dielectric is formed in the first and second trench prior to depositing the polycrystalline layer, the method further comprising:
   removing the first gate dielectric from the second trench after isotropic etching the polycrystalline layer and before forming the second gate dielectric.

6. The method of claim 1, further comprising:
   forming a respective p-doped body region in the semiconductor substrate for each of the first and second field-effect structures; and
   forming a respective n-doped source region in the semiconductor substrate for each of the first and second field-effect structures.

7. The method of claim 6, further comprising:
   forming an electrical connection between the first gate electrode and the n-doped source region of the first field-effect structure.

8. A method for manufacturing a semiconductor device, the method comprising:
   providing a semiconductor substrate having a first side;
   forming a first gate dielectric on the first side of the semiconductor substrate;
   depositing a polycrystalline layer of a polycrystalline semiconductor material on the first gate dielectric;
   forming a mask on the polycrystalline layer to cover a portion of the polycrystalline layer;
   etching the polycrystalline layer using the mask as etching mask to remove the polycrystalline layer from regions which are not covered by the mask, the portion of the polycrystalline layer remaining on the first gate dielectric forming a first gate electrode;
   forming a second gate dielectric on the first side of the semiconductor substrate;
   depositing a metal-containing layer on the second gate dielectric, the metal-containing layer comprising one of a metal, a metal alloy, a metal layer stack, a metal alloy layer stack and any combination thereof
   forming a mask on the metal-containing layer; and
   etching the metal-containing layer using the mask as etching mask to form a second gate electrode.

9. A method for manufacturing a semiconductor device, the method comprising:
   providing a semiconductor substrate having a first side;
   forming, at the first side of the semiconductor substrate, a first trench in the semiconductor substrate for a first field-effect structure and a second trench in the semiconductor substrate for a second field-effect structure;
   forming a first gate dielectric at least in the first trench;
   depositing a polycrystalline layer of a polycrystalline semiconductor material at least in the first and second trench;
   forming a mask on the polycrystalline layer to cover the polycrystalline layer in the first trench while leaving the polycrystalline layer in the second trench uncovered;

etching the polycrystalline layer using the mask as etching mask to remove the polycrystalline layer from the second trench, the portion of the polycrystalline layer remaining in the first trench forming a first gate electrode;

forming a second gate dielectric at least in the second trench; and depositing a metallic material comprising one of a metal, a metal alloy, a metal layer stack, a metal alloy layer stack and any combination thereof into the second trench to form a second gate electrode.

10. The method of claim 9, wherein the first gate dielectric is formed in the first and second trench prior to depositing the polycrystalline layer, the method further comprising:

removing the first gate dielectric using at least one of the mask and the etched polycrystalline layer as etching mask after anisotropic etching the polycrystalline layer and before forming the second gate dielectric.

11. The method of claim 9, further comprising:

forming a respective p-doped body region in the semiconductor substrate for each of the first and second field-effect structures; and forming a respective n-doped source region in the semiconductor substrate for each of the first and second field-effect structures.

12. The method of claim 11, further comprising:

forming an electrical connection between the first gate electrode and the n-doped source region of the first field-effect structure.

* * * * *